(12) United States Patent
Yamazaki

(10) Patent No.: US 8,603,841 B2
(45) Date of Patent: Dec. 10, 2013

(54) MANUFACTURING METHODS OF SEMICONDUCTOR DEVICE AND LIGHT-EMITTING DISPLAY DEVICE

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 181 days.

(21) Appl. No.: 13/216,493

(22) Filed: Aug. 24, 2011

(65) Prior Publication Data

US 2012/0052606 A1     Mar. 1, 2012

(30) Foreign Application Priority Data

Aug. 27, 2010 (JP) ................. 2010-190850

(51) Int. Cl.
    *H01L 21/00*     (2006.01)
(52) U.S. Cl.
    USPC ..................... 438/23; 257/E21.002
(58) Field of Classification Search
    USPC ............ 438/23, 104; 257/E33.019, E21.698, 257/E21.002
    See application file for complete search history.

(56) References Cited

U.S. PATENT DOCUMENTS

| | | | |
|---|---|---|---|
| 5,477,355 A | 12/1995 | Sasaki et al. | |
| 5,731,856 A | 3/1998 | Kim et al. | |
| 5,744,864 A | 4/1998 | Cillessen et al. | |
| 5,886,761 A | 3/1999 | Sasaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Toshio Kamiya et al.; "Carrier transport properties and electronic structures of amorphous oxide semiconductors: the present status"; Solid State Physics; Sep. 1, 2009; pp. 621-633; vol. 44, No. 9; Agne Gijutsu Center.

(Continued)

*Primary Examiner* — William D Coleman
*Assistant Examiner* — Christine Enad
(74) *Attorney, Agent, or Firm* — Fish & Richardson P.C.

(57) ABSTRACT

An object is to simplify a manufacturing process of a transistor, and to manufacture a light-emitting display device not only with a smaller number of photomasks compared to the number of photomasks used in the conventional method but also without an additional step. By using an intrinsic or substantially intrinsic high-resistance oxide semiconductor for a semiconductor layer included in the transistor, so that a step of processing the semiconductor layer into an island shape in each transistor can be omitted. Unnecessary portions of the semiconductor layer are etched away at the same time as a step of forming an opening in an insulating layer formed in an upper layer of the semiconductor layer, so that the number of photolithography steps is reduced.

27 Claims, 19 Drawing Sheets

(56) References Cited

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0171085 A1* | 11/2002 | Suzawa et al. | 257/72 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0250260 A1* | 11/2005 | Hayase et al. | 438/149 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0258033 A1* | 11/2006 | Cheng et al. | 438/30 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0146150 A1* | 6/2009 | Hosoya | 257/59 |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0096634 A1* | 4/2010 | Park et al. | 257/59 |
| 2010/0109002 A1 | 5/2010 | Itagaki et al. | |
| 2010/0163865 A1 | 7/2010 | Arai | |
| 2011/0084265 A1 | 4/2011 | Arasawa et al. | |
| 2011/0085104 A1 | 4/2011 | Arasawa et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-179069 A | 6/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

(56) References Cited

OTHER PUBLICATIONS

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kamiya et al., "Carrier Transport Properties and Electronic Structures of Amorphous Oxide," Solid State Physics, vol. 44, pp. 621-633, with full English translation, 2009.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

\* cited by examiner

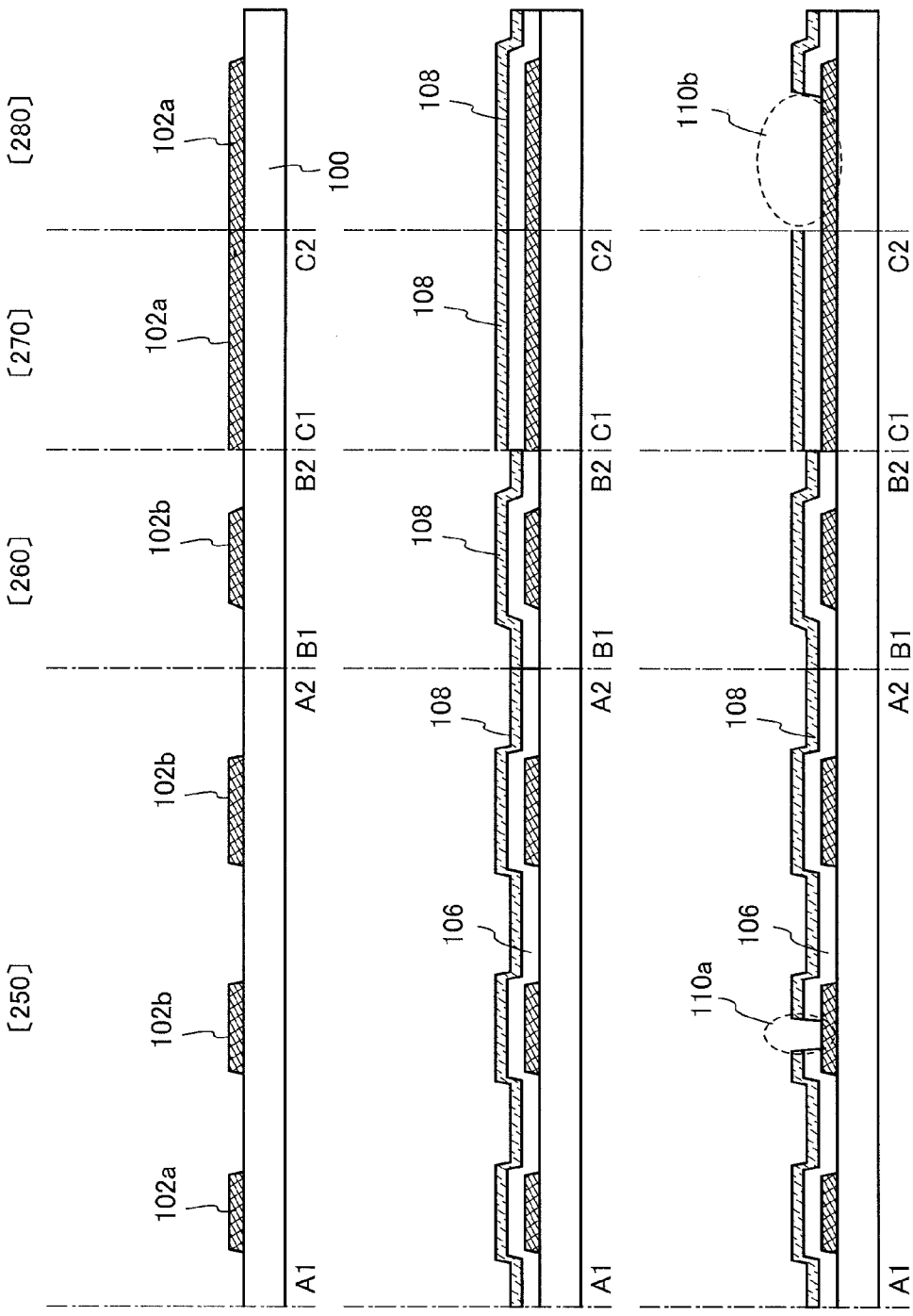

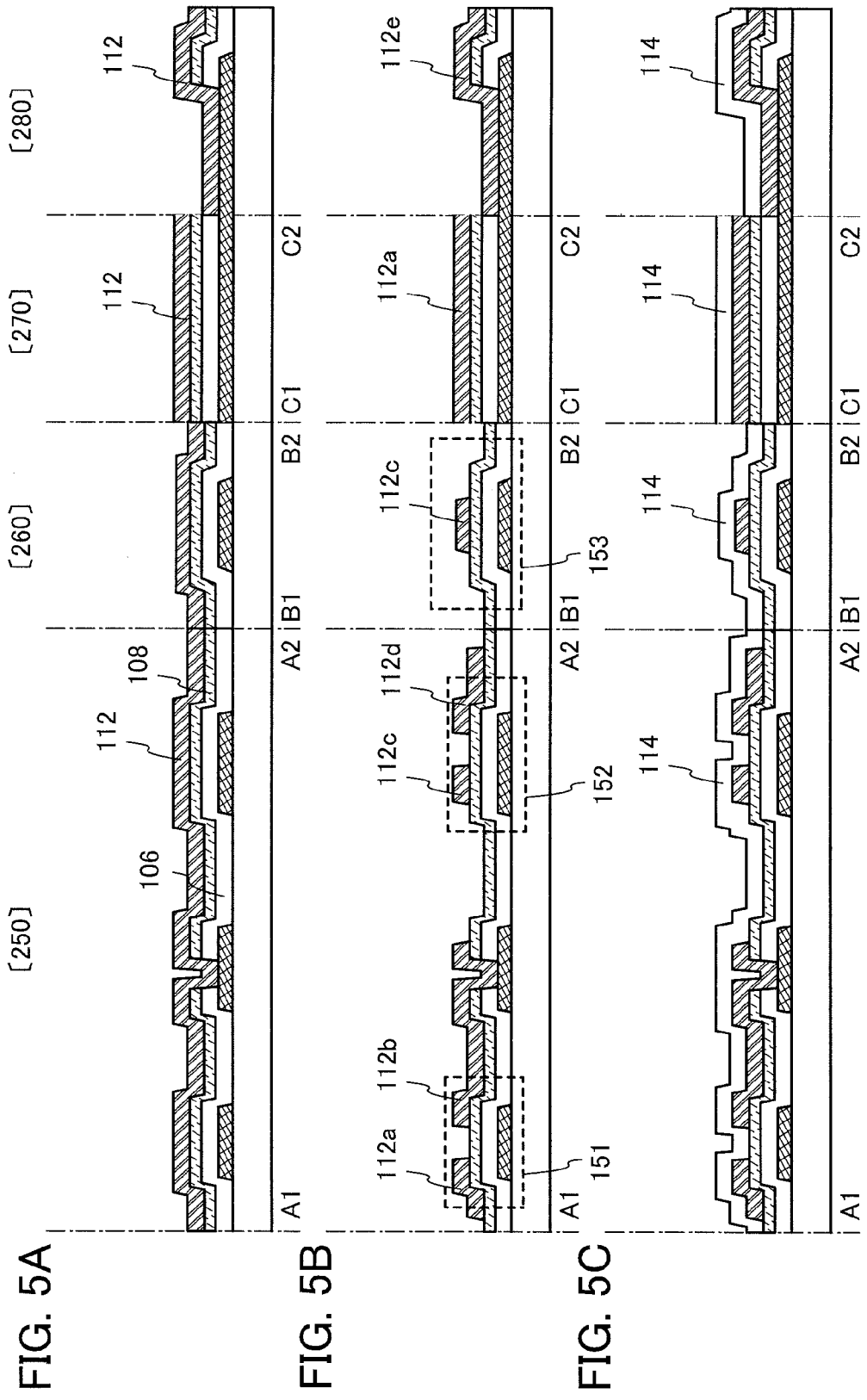

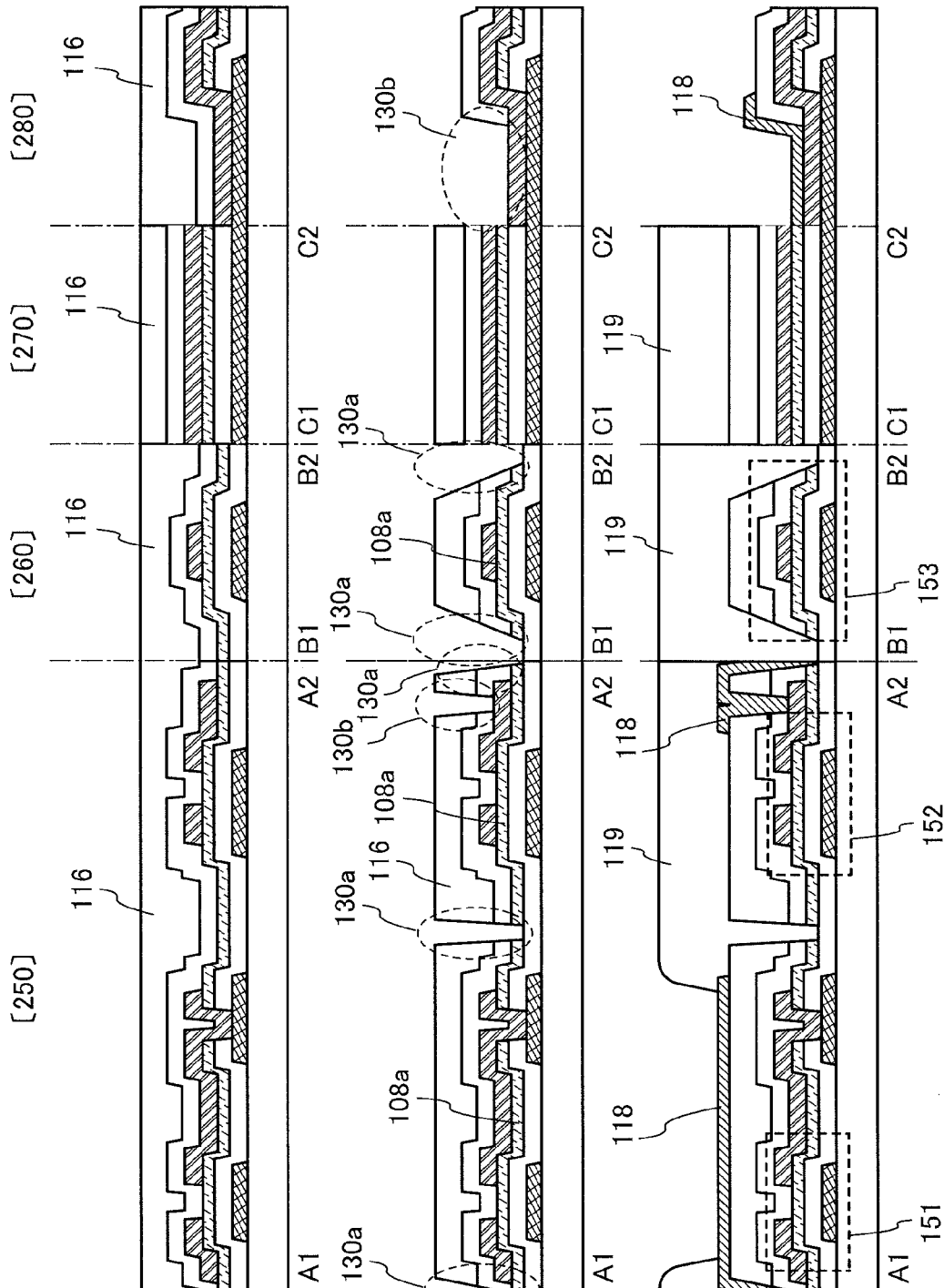

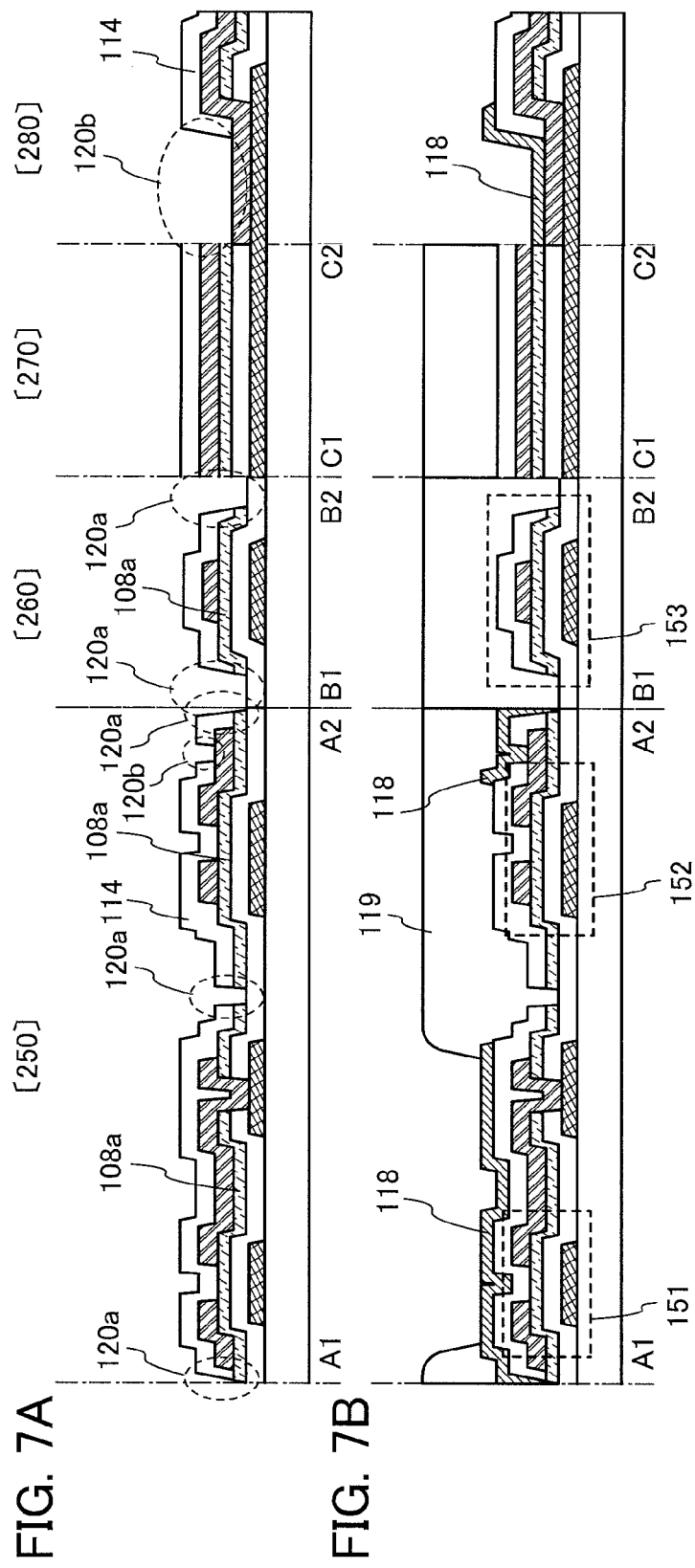

● In
○ Sn
○ Zn
● O

FIG. 18A
FIG. 18B
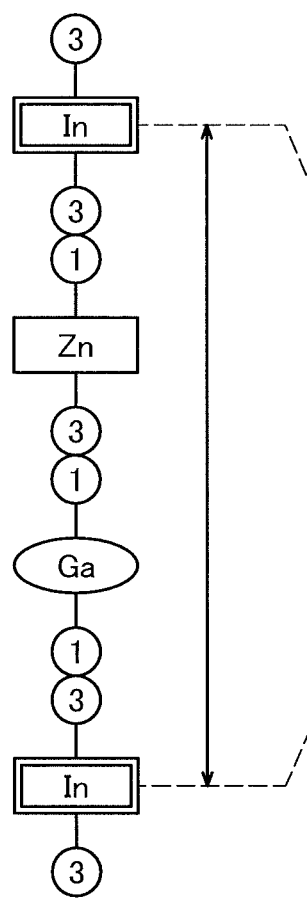
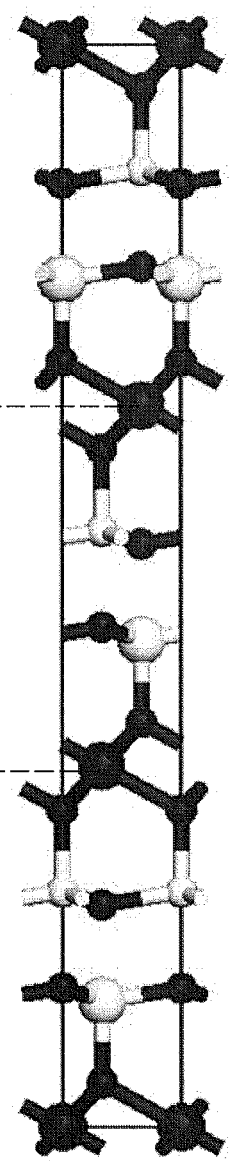
FIG. 18C
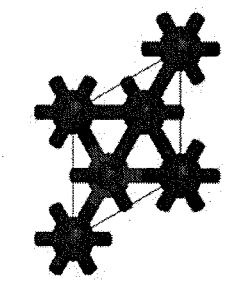
● In
○ Ga
○ Zn
● O

- In
- Ga or Zn
- O

- In
- Ga
- Zn
- O

MANUFACTURING METHODS OF SEMICONDUCTOR DEVICE AND LIGHT-EMITTING DISPLAY DEVICE

BACKGROUND OF THE INVENTION

1. Field of the Invention

The present invention relates to manufacturing methods of a semiconductor device a light-emitting display device including a transistor.

2. Description of the Related Art

In recent years, thin film transistors that are formed using a semiconductor thin film having a thickness of several nanometers to several hundreds of nanometers over a substrate having an insulating surface such as a glass substrate have been attracting attentions. Thin film transistors have been widely used for ICs (integrated circuits) and electronic devices typified by electrooptic devices. Thin film transistors have been rapidly developed particularly as switching elements for image display devices typified by EL (electroluminescence) display devices and the like.

In an active matrix EL display device, a voltage is applied between one electrode and the other electrode, which sandwich an EL layer (including a light-emitting layer), of a light-emitting element provided in a selected pixel, whereby a current is generated in the EL layer and the light-emitting layer emits light. A viewer perceives this light emission as a display pattern. In an active matrix EL display device, pixels arranged in a matrix are driven with switching elements, thereby forming a display pattern on a screen.

The application range of the active matrix EL display devices is expanding, and demands for larger screen size, higher definition, and higher aperture ratio are increasing. In addition, it is demanded that the active matrix display device have high reliability and that a production method of the active matrix display device offers high yield and reduces production cost. Simplification of a process is one way for increasing productivity and reducing manufacturing cost.

In an active matrix display device, thin film transistors are mainly used as switching elements. In manufacturing thin film transistors, it is important that the number of photolithography steps be reduced or the photolithography steps be simplified in order to simplify a process as a whole. For example, when one photolithography step is added, the following steps are further needed: resist application, prebaking, light exposure, development, postbaking, and the like, and moreover other steps before and after the aforementioned steps, such as film formation and etching and further resist removal, cleaning, drying, and the like. Therefore, even when only one photolithography step is added in the manufacturing process, the number of steps relating to the photolithography step is significantly increased. Thus, many techniques for reducing the number of photolithography steps or simplifying the photolithography steps in the manufacturing process have been developed.

Thin film transistors are broadly classified into top gate thin film transistors, in which a channel formation region is provided below a gate electrode, and bottom gate thin film transistors, in which a channel formation region is provided above a gate electrode. These thin film transistors are generally manufactured using at least five photomasks.

Further, as conventional techniques for simplifying the photolithography steps, complicated techniques such as backside light exposure, resist reflow, and a lift off method are often used and a particular apparatus is required in many cases. Using such complicated techniques may cause various problems, which leads to a decrease in yield. Furthermore, there has often been no option but to sacrifice electric characteristics of thin film transistors.

As typical means for simplifying the photolithography steps in the manufacturing process of a thin film transistor, a technique using a multi-tone mask (called a half-tone mask or a gray-tone mask) is widely known. As a technique for reducing the number of manufacturing steps by using a multi-tone mask, Patent Document 1 is disclosed, for example.

REFERENCE

[Patent Document 1] Japanese Published Patent Application No. 2003-179069

SUMMARY OF THE INVENTION

In the case of using a multi-tone mask, the number of masks can be reduced; however, an additional step such as an ashing step is necessary in order to change the resist mask into another shape.

It is an object of one embodiment of the present invention to manufacture a light-emitting display device not only with a smaller number of photomasks compared to the number of photomasks used in the conventional method but also without an additional step.

One embodiment of the present invention disclosed in this specification relates to a method for manufacturing a light-emitting display device by using a high-resistance oxide semiconductor for a semiconductor layer included in a transistor, so that a step of processing the semiconductor layer into an island shape in each transistor is omitted and the number of photolithography steps is reduced.

One embodiment of the present invention disclosed in this specification is a method for manufacturing a light-emitting display device including steps of forming a first conductive film over a substrate, forming a first resist mask over the first conductive film, forming a first gate electrode and a second gate electrode by selectively etching the first conductive film with the use of the first resist mask, forming a first insulating film which functions as a gate insulating layer over the first gate electrode and the second gate electrode, forming a semiconductor film over the insulating film, forming a second resist mask over the semiconductor film, forming a first opening by selectively etching part of the semiconductor film and the first insulating film over the second gate electrode with the use of the second resist mask, forming a second conductive film so as to cover the semiconductor film and the first opening, forming a third resist mask over the second conductive film, forming a first transistor including the first gate electrode, the first source electrode, and the first drain electrode and a second transistor including the second gate electrode, the second source electrode, and the second drain electrode by forming one of a first source electrode and a first drain electrode electrically connected to a source or drain wiring, the other of the first source electrode and the first drain electrode electrically connected to the second gate electrode, one of a second source electrode and a second drain electrode electrically connected to a power source wiring, and the other of the second source electrode and the second drain electrode by selectively etching the second conductive film with the use of the third resist mask, forming a second insulating film functioning as a protective insulating film over the first source electrode and the first drain electrode, the second source electrode and the second drain electrode, and the semiconductor film, forming a fourth resist mask over the second insulating film, forming a second opening by selectively etching the second insulating film and the semiconductor film with the use of the fourth resist mask and simultaneously forming a third opening in the second insulating film so as to expose part of the other of the second source electrode and the second drain electrode, forming a third conductive film over the second insulating film so as to cover the third opening, forming a fifth resist mask over the third conductive film, forming a first pixel electrode by selectively etching the third conductive film with the use of the fifth resist mask, forming a third insulating film so as to cover a periphery of the second opening, the third opening, and the pixel electrode, forming a layer including an organic compound over the pixel electrode, and selectively faulting a second pixel electrode over the layer including an organic compound.

In this specification and the like, ordinal numbers such as "first", "second", and "third" are used in order to avoid confusion among components, and the terms do not limit the components numerically.

Another embodiment of the present invention disclosed in this specification is a method for manufacturing a light-emitting display device including steps of forming a first conductive film over a substrate, forming a first resist mask over the first conductive film, forming a first gate electrode and a second gate electrode by selectively etching the first conductive film with the use of the first resist mask, forming a first insulating film which functions as a gate insulating layer over the first gate electrode and the second gate electrode, forming a semiconductor film over the insulating film, forming a second resist mask over the semiconductor film, forming a first opening by selectively etching part of the semiconductor film and the first insulating film over the second gate electrode with the use of the second resist mask, forming a second conductive film so as to cover the semiconductor film and the first opening, forming a third resist mask over the second conductive film, forming a first transistor including the first gate electrode, the first source electrode, and the first drain electrode and a second transistor including the second gate electrode, the second source electrode, and the second drain electrode by forming one of a first source electrode and a first drain electrode electrically connected to a source or drain wiring, the other of the first source electrode and the first drain electrode electrically connected to the second gate electrode, one of a second source electrode and a second drain electrode electrically connected to a power source wiring, and the other of the second source electrode and the second drain electrode by selectively etching the second conductive film with the use of the third resist mask, and the first drain electrode and a second transistor including a second gate electrode, the second source electrode, and the second drain electrode are formed, forming a second insulating film functioning as a protective insulating film over the first source electrode and drain electrode, the second source electrode and drain electrode, and the semiconductor film, forming a third insulating film as a planarizing insulating film over the second insulating film, forming a fourth resist mask over the third insulating film, forming a second opening by selectively etching the third insulating film, the second insulating film, and the semiconductor film with the use of the fourth resist mask and simultaneously forming a third opening in the second insulating film so as to expose part of the other of the second source electrode and the second drain electrode, forming a third conductive film over the third insulating film so as to cover the third opening, forming a fifth resist mask over the third conductive film, forming a first pixel electrode by selectively etching the third conductive film with the use of the fifth resist mask, forming a fourth insulating film so as to cover a periphery of the second opening, the third opening, and the pixel electrode, forming a layer including an organic compound over the pixel electrode, and forming a second pixel electrode over the layer including an organic compound.

An oxide semiconductor is preferably used for the semiconductor film. An i-type or substantially i-type oxide semiconductor has extremely high resistance and therefore can be regarded as an insulator in constructing a circuit. Thus, even when a plurality of transistors is framed with the same island-shaped semiconductor layer, the transistors can operate without interfering with each other.

Since an oxide semiconductor can be regarded as an insulator, a method for manufacturing a light-emitting display device, in which a step of forming an island-shaped semiconductor layer in each transistor can be omitted to reduce the number of photolithography steps, can be provided.

BRIEF DESCRIPTION OF THE DRAWINGS

FIGS. 4A to 4C are cross-sectional views illustrating one embodiment of a method for manufacturing a light-emitting display device.

FIGS. 5A to 5C are cross-sectional views illustrating one embodiment of a method for manufacturing a light-emitting display device.

FIGS. 6A to 6C are cross-sectional views illustrating one embodiment of a method for manufacturing a light-emitting display device.

FIGS. 7A and 7B are cross-sectional views illustrating one embodiment of a method for manufacturing a light-emitting display device.

FIGS. 18A to 18C illustrate a structure of an oxide material.

DETAILED DESCRIPTION OF THE INVENTION

Figure 1A:
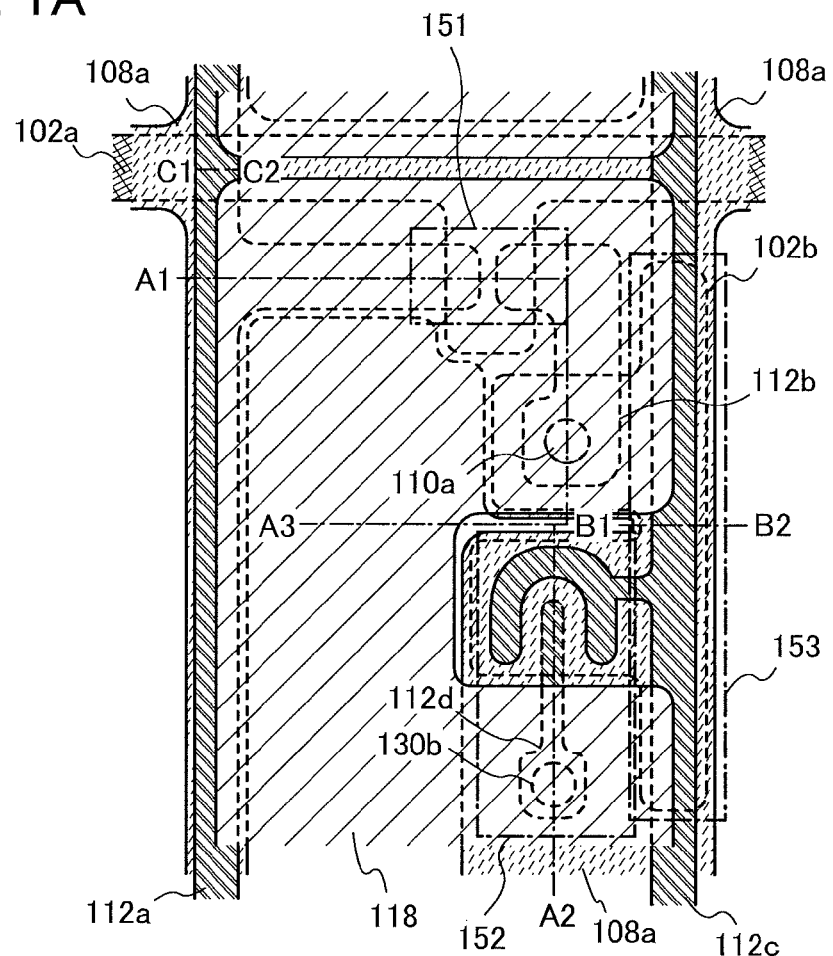
FIG. 1A is a plan view and FIG. 1B is a cross-sectional view illustrating one embodiment of a light-emitting display device.

Embodiments of the present invention will be described below in detail with reference to the accompanying drawings.

However, the present invention is not limited to the description below and it is easily understood by those skilled in the art that the mode and details can be changed variously. Therefore, the present invention is not construed as being limited to description of the embodiments. In describing structures of the present invention with reference to the drawings, the same reference numerals are used in common for the same portions in different drawings. The same hatching pattern is applied to similar parts, and the similar parts are not especially denoted by reference numerals in some cases.

Embodiment 1

In this embodiment, an example of a structure of a pixel portion included in a light-emitting display device of one embodiment of the present invention will be described.

Figure 1B:
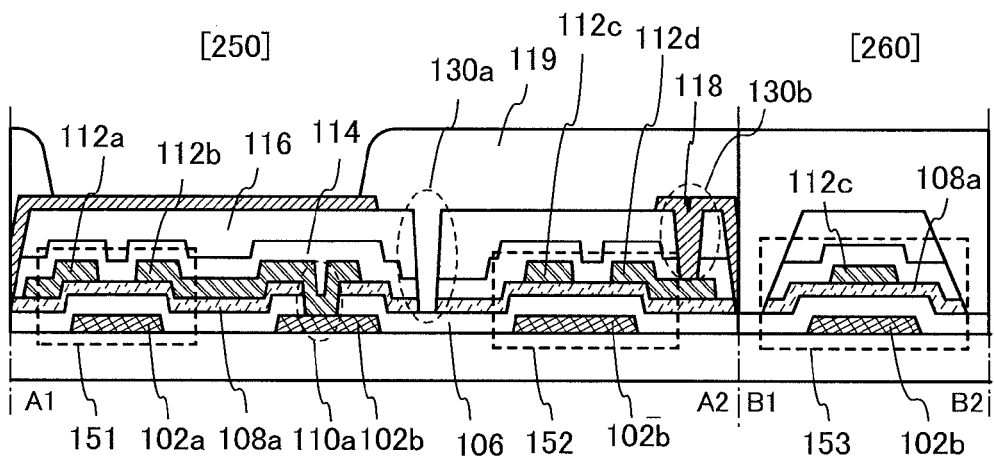
Figure 3A:
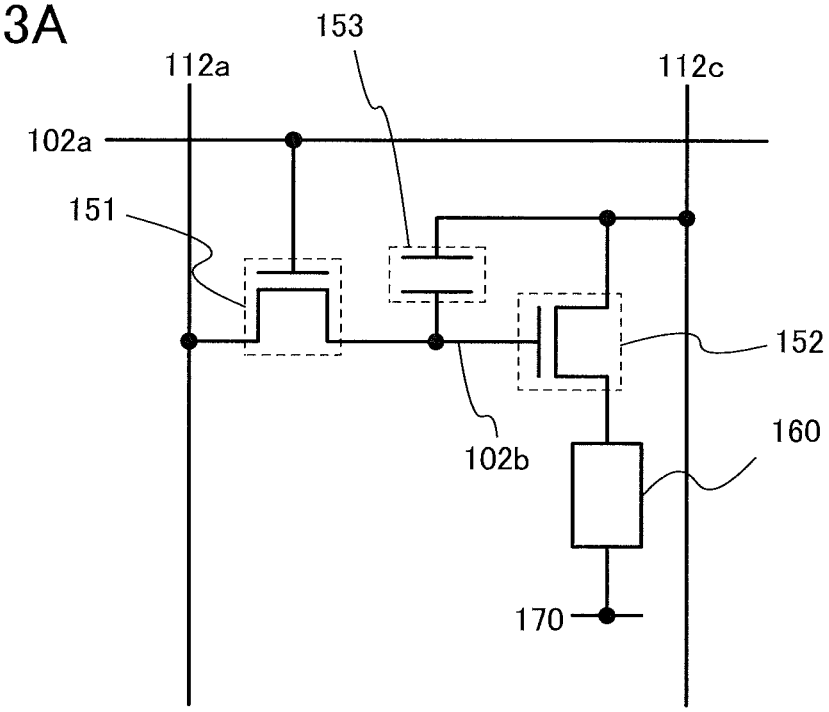
FIGS. 3A and 3B are each an equivalent circuit diagram of a pixel portion in a light-emitting display device.

FIGS. 1A and 1B show an example of a pixel portion of an active matrix light-emitting display device to which one embodiment of the present invention is applied. FIG. 1A is a plan view of the pixel portion of the light-emitting display device. FIG. 1B is a cross-sectional view taken along a line A1-A2 in FIG. 1A. FIG. 3A is an equivalent circuit of the pixel portion of the active matrix light-emitting display device shown in FIGS. 1A and 1B. Note that an EL layer 160 and a second pixel electrode layer (a common electrode) 170 shown in FIG. 3A are not shown in FIGS. 1A and 1B.

Note that in this specification, an "EL layer" refers to a layer provided between a pair of electrodes in a light-emitting element. Thus, a light-emitting layer between electrodes, which contains an organic compound which is a light-emitting substance, is one embodiment of the EL layer.

In this embodiment, a structure and a manufacturing method of the pixel portion of the light-emitting display device will be described. A transistor in this embodiment refers to a first transistor 151 and/or a second transistor 152 shown in FIGS. 1A and 1B. In addition, the transistors are n-channel transistors using an oxide semiconductor that is described below.

The pixel portion of the active matrix light-emitting display device shown in FIGS. 1A and 1B includes a first transistor 151 including a first gate electrode layer 102a, a gate insulating layer 106, a semiconductor layer 108a, and first source and drain electrode layers 112a and 112b and a second transistor 152 including a second gate electrode layer 102b, a gate insulating layer 106, a semiconductor layer 108a, and second source and drain electrode layers 112c and 112d.

Here, the first gate electrode layer 102a is connected to a gate wiring. The first source or drain electrode layer 112a is connected to a source or drain wiring. The first source or drain electrode layer 112b is connected to the second gate electrode layer 102b through a first opening 110a. The second source or drain electrode layer 112c is connected to a power source wiring. The second source or drain electrode layer 112d is connected to a first pixel electrode layer 118 through a third opening 130b. Note that in FIG. 1A, the gate wiring is formed using the same layer as the first gate electrode layer and is thus denoted by the same reference numeral as the first gate electrode layer. The source or drain wiring is formed using the same layer as one of the first source and drain electrode layers and is thus denoted by the same reference numeral as one of the first source and drain electrode layers. The power source wiring is formed using the same layer as one of the second source and drain electrode layers and is thus denoted by the same reference numeral as one of the second source and drain electrode layers.

Note that although the first transistor 151 is illustrated to have a single-gate structure in FIGS. 1A and 1B, a multi-gate structure can be employed. The off-state current of a transistor with a multi-gate structure is small; thus, display characteristics of a light-emitting display device including the transistor can be improved.

Further, the second gate electrode layer 102b and the power source wiring (the second source or drain electrode layer 112c) have a region overlapping with each other with the gate insulating layer 106 and the semiconductor layer 108a interposed therebetween, and form a capacitor 153. In such a manner, a dielectric layer is formed to have a stacked-layer structure; thus, even when a pinhole is generated in one dielectric layer, the pinhole is covered with another dielectric layer; thus, the capacitor 153 can be operated normally. In addition, a relative permittivity of an oxide semiconductor is as high as 14 to 16; thus, when an oxide semiconductor is used for the semiconductor layer 108a, the capacitance of the capacitor 153 can be larger.

A protective insulating layer 114 and a planarizing insulating layer 116 are formed over the first transistor 151 and the second transistor 152. A third opening 130b and a second opening 130a are formed in part of the protective insulating layer 114 and the planarizing insulating layer 116. Part of the gate insulating layer 106 is exposed through the second opening 130a and part of the second source or drain electrode layer 112d is exposed through the third opening 130b. The planarizing insulating layer 116 may be omitted.

The third opening 130b is covered with part of the first pixel electrode layer 118 and an insulating material serving as a partition wall 119 fills in the second opening 130a. Here, the partition wall 119 is not shown in FIG. 1A. The partition wall 119 is formed so as to cover an end portion of the first pixel electrode layer 118, a region with an uneven surface in the above structure, and the like. With the partition wall 119, the EL layer and the second pixel electrode layer which are formed later over the first pixel electrode layer 118 and the like can be prevented from disconnecting.

Figure 2:
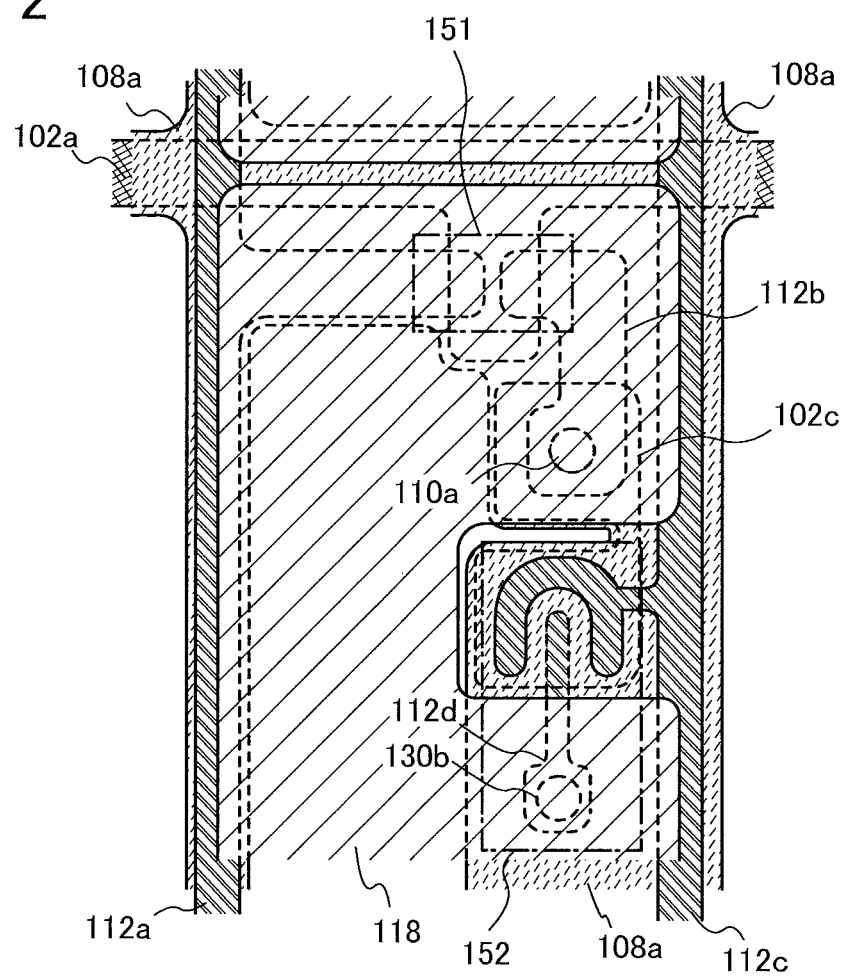
FIG. 2 is a plan view illustrating a light-emitting display device without a capacitor.
Figure 3B:
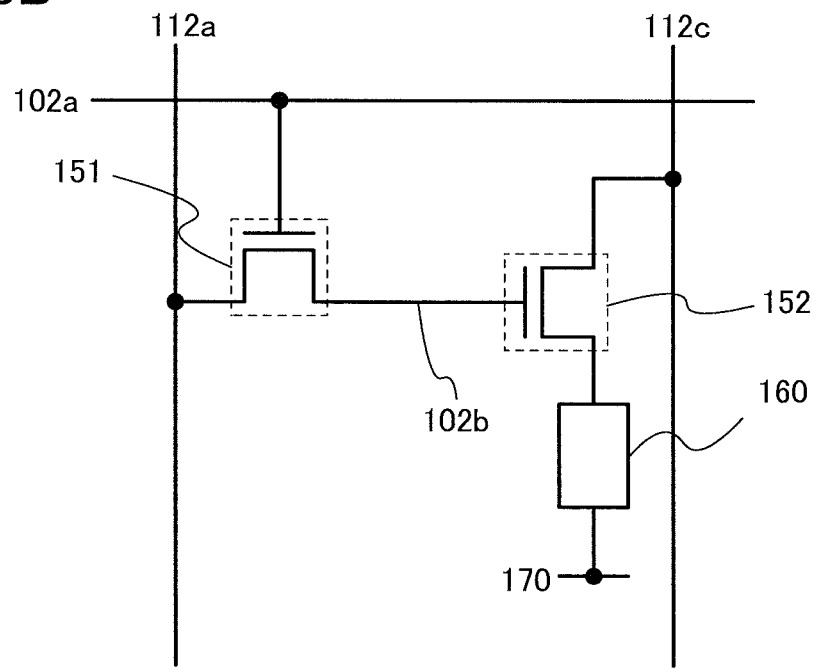

Note that a structure shown in FIG. 2 in which a capacitor is not formed can be employed. In FIG. 2, the second gate electrode layer 102c is not overlapped with the power source wiring (the second source or drain electrode layer 112c) and a capacitor is not fanned. FIG. 3B shows an equivalent circuit of the structure.

As a material for the semiconductor layer 108a, an oxide semiconductor is preferably used. For the oxide semiconductor layer, a thin film using a material represented by the chemical formula, $InMO_3(ZnO)_m$ (m>0), can be used. Here, M represents one or more metal elements selected from Sn, Zn, Ga, Al, Mn, and Co. For example, M can be Ga, Ga and Al, Ga and Mn, Ga and Co, or the like.

For example, an In—Ga—Zn—O-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn—O-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions is preferably used.

However, the composition is not limited to those described above, and a material having the appropriate composition may be used depending on needed semiconductor characteristics (e.g., mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case where the In—Sn—Zn—O-based oxide is used. However, the mobility can be increased by reducing the defect density in the bulk also in the case where the In—Ga—Zn—O-based oxide is used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In a crystalline oxide semiconductor, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, or more preferably less than or equal to 0.1 nm.

Note that the average surface roughness (Ra) is obtained by expanding, into three dimensions, center line average roughness that is defined by JIS B 0601 so as to be able to apply it to a measurement surface. The Ra can be expressed as an "average value of the absolute values of deviations from a reference surface to a designated surface" and is defined by the following formula.

$$Ra = \frac{1}{S_0}\int_{y_1}^{y_2}\int_{x_1}^{x_2}|f(x,y)-Z_0|dxdy \quad \text{[FORMULA 1]}$$

In the above formula, $S_0$ represents the area of a measurement surface (a rectangular region which is defined by four points represented by coordinates $(x_1, y_1)$, $(x_1, y_2)$, $(x_2, y_1)$, and $(x_2, y_2)$), and $Z_0$ represents an average height of the measurement surface. Ra can be measured using an atomic force microscope (AFM).

The transistor formed using an oxide semiconductor for the semiconductor layer 108a has electric characteristics of much lower off-state current. The oxide semiconductor is preferably purified by sufficient removal of impurities such as hydrogen or sufficient supply of oxygen. Specifically, the concentration of hydrogen in the oxide semiconductor is lower than or equal to $5\times10^{19}$ atoms/cm$^3$, preferably lower than or equal to $5\times10^{18}$ atoms/cm$^3$, or more preferably lower than or equal to $5\times10^{17}$ atoms/cm$^3$, for example. Note that the concentration of hydrogen in the oxide semiconductor is measured by secondary ion mass spectrometry (SIMS). As described above, hydrogen is reduced to a sufficiently low concentration so that the oxide semiconductor is purified, and oxygen is sufficiently supplied, whereby the density of carriers generated due to a donor such as hydrogen in the oxide semiconductor in which defect levels in an energy gap due to oxygen deficiency are reduced is less than $1\times10^{12}$/cm$^3$, preferably less than $1\times10^{11}$/cm$^3$, or more preferably less than $1.45\times10^{10}$/cm$^3$. In addition, for example, the off-state current (here per unit channel width (1 μm)) at room temperature (25° C.) is less than or equal to 100 zA (1 zA (zeptoampere) is $1\times10^{-21}$ A) or preferably less than or equal to 10 zA. In this manner, by using an i-type (intrinsic) or substantially i-type oxide semiconductor, the transistor having excellent off-state current characteristics can be obtained.

Characteristics of holding electric charges held in a pixel are extremely excellent; thus, in the case where a capacitor is not provided or the area of a storage capacitor becomes smaller than that in the structure shown in FIGS. 1A and 1B, an image can be held without any problem with a frame frequency of 60 Hz, which is general, or 60 Hz or less.

Note that it has been pointed out that an oxide semiconductor is insensitive to impurities, there is no problem when a considerable amount of metal impurities is contained in the film, and therefore soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI* (*SOLID STATE PHYSICS*), 2009, Vol. 44, pp. 621-633). But such consideration is not appropriate. The minimum amount of alkali metals contained in an oxide semiconductor when measured using secondary ion mass spectrometry is as follows: sodium (Na) is at less than or equal to $5\times10^{16}$ cm$^{-3}$, preferably less than or equal to $1\times10^{16}$ cm$^{-3}$, further preferably less than or equal to $1\times10^{15}$ cm$^{-3}$, lithium (Li) is at less than or equal to $5\times10^{15}$ cm$^{-3}$, preferably less than or equal to $1\times10^{15}$ cm$^{-3}$, and potassium (K) is less than or equal to $5\times10^{15}$ cm$^{-3}$, preferably less than or equal to $1\times10^{15}$ cm$^{-3}$.

An alkali metal and an alkaline earth metal are adverse impurities for the oxide semiconductor and are preferably contained as little as possible. An alkali metal, in particular, Na diffuses into an oxide and becomes Na$^+$ when an insulating film which is formed in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the concentration of hydrogen in the oxide semiconductor is extremely low. Therefore, the concentration of an alkali metal is strongly required to set to the above value in the case where the concentration of hydrogen in the oxide semiconductor is lower than or equal to $5\times10^{19}$ cm$^{-3}$, particularly lower than or equal to $5\times10^{18}$ cm$^{-3}$.

In addition, the i-type or substantially i-type oxide semiconductor has extremely high resistance and thus can be regarded as an insulator in a circuit configuration. For this reason, even when a plurality of transistors is formed with one island-shaped semiconductor layer, transistors can be driven without interfering with each other. Note that two transistors are formed with one island-shaped semiconductor layer in this embodiment; however, in the case where the semiconductor layer is not left in the capacitor portion, the semiconductor layer of the two transistors can be separated from each other.

In addition, in the structure of FIG. 1B, there is a region where the first pixel electrode layer 118 is in contact with the side surface of the semiconductor layer 108a; however, a problem of leakage current or the like does not occur because the i-type or substantially i-type oxide semiconductor can be regarded as an insulator as described above.

Figure 14A:
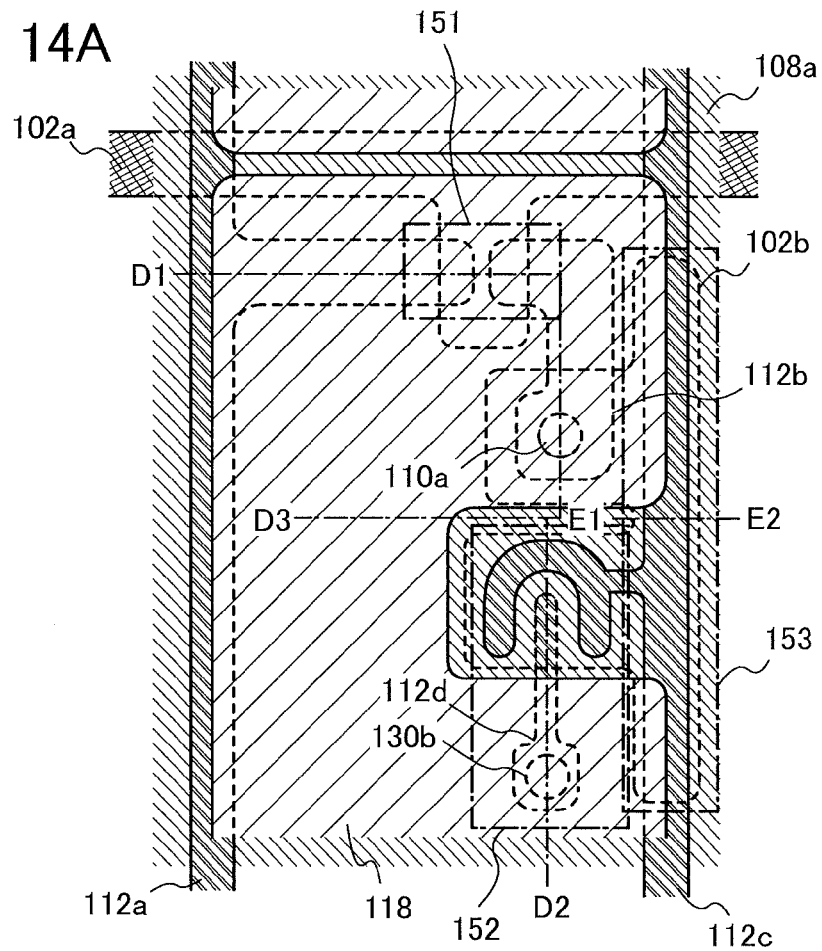
FIG. 14A is a plan view and FIG. 14B is a cross-sectional view illustrating one embodiment of a light-emitting display device.
Figure 14B:
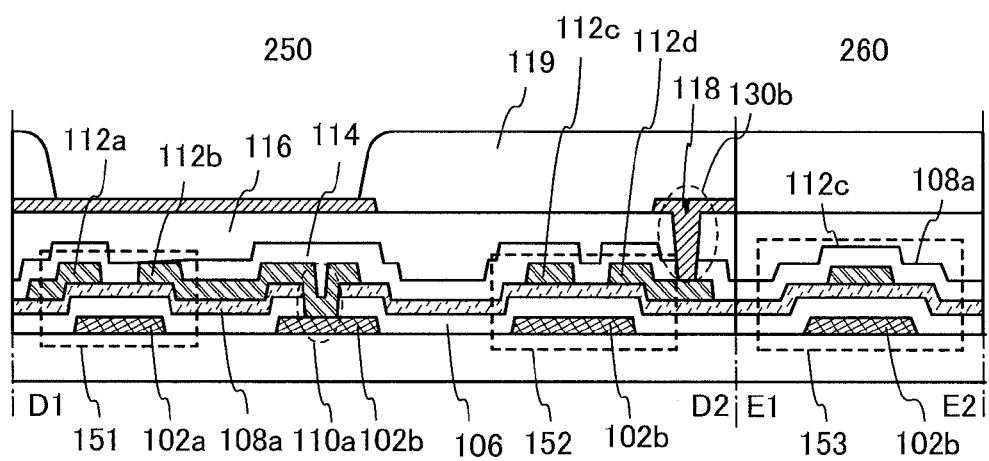

In the case where an oxide semiconductor is used for the semiconductor layer 108a, the semiconductor layer may be left on the entire pixel region as shown in FIGS. 14A and 14B. An oxide semiconductor layer has high resistance as described above and has a light-transmitting property with respect to a visible light. For these reason, even when light emitted from the light-emitting element is emitted to the transistor side, light can be transmitted.

In the second transistor 152 of this embodiment, the second source or drain electrode layer 112d is surrounded by the second source or drain electrode layer 112c having a U-shape (a C-shape, a reversed C-shape, or a horseshoe-shape). With such a shape, a sufficient channel width can be secured even when the area of the transistor is small; thus, the amount of current flowing during a conduction state of the transistor (also referred to as an on-state current) can be increased.

One embodiment of the present invention has such a feature that the number of photolithography steps can be reduced by successively etching the protective insulating layer 114 and a semiconductor film 108. Then, an example of a manufacturing method will be described in detail with reference to FIGS. 4A to 4C, FIGS. 5A to 5C, FIGS. 6A to 6C, and FIGS. 7A and 7B.

Note that a method for manufacturing a transistor portion 250 is mainly described here, and a method for manufacturing a capacitor portion 260, a wiring intersection portion 270, and an FPC connection portion 280, which are illustrated, will be described as necessary.

First, a first conductive film is formed over the substrate 100 having an insulating surface and then the first gate electrode layer 102a and a second gate electrode layer 102b are formed through a first photolithography step and an etching step (see FIG. 4A).

Note that a resist mask used in a photolithography step may be formed by an inkjet method. When the resist mask is formed with an ink-jet method, a photomask is not used; therefore, manufacturing costs can be further reduced. The resist mask is removed after etching, and description thereof in each photolithography step is omitted.

Here, a substrate having heat resistance enough to withstand at least heat treatment to be subsequently performed can be used as the substrate 100. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate made of silicon, silicon carbide, or the like; a compound semiconductor substrate made of silicon germanium or the like; an SOI substrate; a metal substrate such as a stainless steel film; a highly heat-resistance resin substrate such as a polyimide film; or the like can also be used as the substrate 100.

An insulating film serving as a base film may be provided between the substrate 100 and the first gate electrode layer 102a, and the between the substrate 100 and the second gate electrode layer 102b. The base film has a function of preventing diffusion of impurity elements from the substrate 100 and can be fanned from a film selected from a silicon oxide film, a silicon oxynitride film, a silicon nitride film, a hafnium oxide film, an aluminum oxide film, a gallium oxide film, and a gallium aluminum oxide film. The structure of the base film is not limited to a single-layer structure, and may be a stacked-layer structure of a plurality of the above films.

The first gate electrode layer 102a and the second gate electrode layer 102b can be formed using a metal material such as molybdenum, titanium, tantalum, tungsten, aluminum, copper, neodymium, or scandium, or an alloy material which includes any of these metal materials as a main component by a sputtering method or the like. The structure of the gate electrode layers is not limited to a single-layer structure, and may be a layered structure of a plurality of the above materials. For example, a stack of aluminum and molybdenum, a stack of aluminum and titanium, a stack of copper and molybdenum, a stack of copper and tungsten, or the like can be used. Here, a stack in which molybdenum is stacked over copper is used.

Next, the gate insulating layer 106 is formed over the first gate electrode layer 102a and the second gate electrode layer 102b by a CVD method, a sputtering method, or the like. The gate insulating layer 106 is preferably formed so as to contain silicon oxide, silicon nitride, silicon oxynitride, aluminum oxide, tantalum oxide, hafnium oxide, yttrium oxide, gallium oxide, lanthanum oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate to which nitrogen is added ($HfAlO_xN_y$ ($x>0$, $y>0$)), or the like. Alternatively, the gate insulating layer 106 can be formed using a mixed material thereof by a plasma CVD method, a sputtering method, or the like. Alternatively, the gate insulating layer 106 can be formed using a mixed material thereof by a plasma CVD method, a sputtering method, or the like. The structure of the gate insulating layer 106 is not limited to a single-layer structure, and may be a stacked-layer structure of a plurality of the above materials. The thickness of the gate insulating layer 106 is not particularly limited. For example, in the case of using silicon oxide as the gate insulating layer 106, the thickness of the gate insulating layer 106 can be greater than or equal to 1 nm and less than or equal to 100 nm, preferably greater than or equal to 10 nm and less than or equal to 50 nm.

It is preferable that an insulating material containing the same kind of component as the semiconductor layer formed later be used for the gate insulating layer 106. Such a material enables the state of the interface with the semiconductor film to be kept well. Here, containing "a component which is the same as that of an semiconductor film" means containing one or more of elements selected from constituent elements of the semiconductor film. For example, in the case where the semiconductor layer is formed using an In—Ga—Zn—O-based oxide semiconductor material, gallium oxide or the like is given as such an insulating material containing the same kind of component as the semiconductor layer.

For the formation of the gate insulating layer 106, a high-density plasma CVD method using microwaves (e.g., with a frequency of 2.45 GHz) is preferably employed because a high-quality insulating layer which is dense and has high breakdown voltage can be formed. The semiconductor layer is formed in close contact with the high-quality gate insulating layer, whereby the interface state density can be reduced.

Moreover, it is possible to use as the gate insulating layer an insulating layer whose quality and characteristics of the interface with the semiconductor layer are improved by heat treatment performed after the formation of the insulating layer. In any case, the gate insulating layer is preferably formed using an insulating layer that can reduce the interface state density with the semiconductor layer to form a favorable interface, as well as having favorable film quality.

In order that hydrogen, a hydroxyl group, and moisture are contained as little as possible in an semiconductor film (here and oxide semiconductor film) formed over the gate insulating layer 106, vacuum heating is preferably performed on the substrate 100 over which layers up to and including the gate insulating layer 106 are formed, in a preheating chamber of a deposition apparatus, so that impurities such as hydrogen and moisture adsorbed to the substrate 100 are eliminated and removed. As an evacuation unit provided for the preheating chamber, a cryopump is preferably used. Note that this preheating treatment can be omitted.

Next, the semiconductor film 108 having a thickness of greater than or equal to 2 nm and less than or equal to 200 nm, preferably greater than or equal to 5 nm and less than or equal to 30 nm is formed over the gate insulating layer 106 (see FIG. 4B).

An oxide semiconductor is preferably used for the semiconductor film 108. An oxide semiconductor to be used preferably includes at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide, a three-component metal oxide such as an In—Ga—Zn—O-based oxide (also referred to as IGZO), an In—Al—Zn—O-based oxide, an In—Sn—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide, a four-component oxide such as an In—Sn—Ga—Zn—O-based oxide, an In—Hf—Ga—Zn—O-based oxide, an In—Al—Ga—Zn—O-based oxide, an In—Sn—Al—Zn—O-based oxide, an In—Sn—Hf—Zn—O-based oxide, or an In—Hf—Al—Zn—O-based oxide can be used.

Note that here, for example, an "In—Ga—Zn—O-based oxide" means an oxide containing In, Ga, and Zn as its main component, in which there is no particular limitation on the ratio of In:Ga:Zn. The In—Ga—Zn—O-based oxide may contain a metal element other than the In, Ga, and Zn.

In particular, when an oxide semiconductor containing indium, an oxide semiconductor containing indium and gallium, or the like is used, a transistor having favorable electrical characteristics can be formed. In this embodiment, a film including an In—Ga—Zn—O-based oxide is formed as the semiconductor film 108 by a sputtering method.

As the target used for a sputtering method, an oxide target having a composition ratio of $In_2O_3:Ga_2O_3:ZnO=1:1:1$ [molar ratio] is used. Alternatively, an oxide target having a composition ratio of $In_2O_3:Ga_2O_3:ZnO=1:1:2$ [molar ratio] may be used.

In the case where an In—Zn—O-based oxide is used as an oxide semiconductor, an oxide target therefore has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in an oxide target used for formation of an In—Zn—O-based oxide semiconductor which has an atomic ratio of In:Zn:O=X:Y:Z, the relation of Z>1.5X+Y is satisfied.

Further, an In—Sn—Zn—O-based oxide can be referred to as ITZO. An oxide target which has a composition ratio of In:Sn:Zn=1:2:2, 2:1:3, 1:1:1, 20:45:35, or the like in an atomic ratio is used.

The filling rate of the target is higher than or equal to 90% and lower than or equal to 100%, preferably higher than or equal to 95% and lower than or equal to 100%. With use of the target with high filling rate, a dense oxide semiconductor film can be formed.

As the sputtering gas, a rare gas (typically, argon), oxygen, or a mixed gas of a rare gas and oxygen can be used. It is preferable to use a high-purity gas from which impurities such as hydrogen, water, a hydroxyl group, and hydride are removed as the sputtering gas.

The oxide semiconductor film is preferably formed in the state where the substrate is heated. The substrate is held in a deposition chamber kept under reduced pressure, and deposition is performed in the state where the substrate temperature is set to a temperature higher than or equal to 200° C. and lower than or equal to 450° C.; thus, the impurity concentration in the oxide semiconductor film can be reduced. Note that the maximum temperature varies depending on materials of the gate electrode layer. In the case of using a stack of copper and molybdenum which have higher melting point, as in this embodiment, or a stack of copper and tungsten, the maximum temperature can be set to 450° C. In the case of using a stack including aluminum whose melting point is low, the maximum temperature is preferably set to 380° C.

In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with a cryopump, a hydrogen atom, a compound containing a hydrogen atom such as water, a compound containing a carbon atom, and the like are evacuated, whereby the impurity concentration in the oxide semiconductor film formed in the deposition chamber can be reduced.

As one example of the film formation condition, the following is given: the distance between the substrate and the target is 100 mm, the pressure is 0.6 Pa, the direct-current (DC) power is 0.5 kW, and the atmosphere is an oxygen atmosphere (the proportion of the oxygen flow is 100%). When a pulsed direct-current power source is used, powder substances (also referred to as particles or dust) that are generated in deposition can be reduced and the film thickness can be uniform.

Then, dehydration or dehydrogenation of the semiconductor layer 108 is performed through first heat treatment. In this specification, the term "dehydration or dehydrogenation" refers to not only elimination of water or a hydrogen molecule but also elimination of a hydrogen atom, a hydroxyl group, or the like.

The heat treatment can be performed in such a way that, for example, an object to be heated is introduced into an electric furnace in which a resistance heating element or the like is used and heated, under a nitrogen atmosphere at 450° C. for 1 hour. The semiconductor film 108 is not exposed to the air during the heat treatment so that entry of water and hydrogen can be prevented.

With this heat treatment, excessive hydrogen (including water and a hydroxyl group) can be removed (dehydration or dehydrogenation), the structure of the oxide semiconductor film can be improved, and defect levels in an energy gap can be reduced. The first heat treatment is performed at a temperature higher than or equal to 250° C. and lower than or equal to 450° C. The length of time of the heat treatment may be about 1 hour as long as the temperature is in the above favorable range. Note that the temperature and the length of time of the heat treatment may be determined as appropriate by a practitioner; for example, the heat treatment may be performed at low temperature for a long time, or at high temperature for a short time. Note that the maximum temperature varies depending on materials of the gate electrode layer. As described above, in the case of using a material including copper, the maximum temperature can be set to 450° C., whereas in the case of using a material including aluminum, the maximum temperature is set to 380° C.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect level in energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

In any case, impurities are reduced by the first heat treatment so that an i-type (intrinsic) or substantially i-type oxide semiconductor film is obtained. Accordingly, a transistor having highly excellent characteristics can be realized.

Note that the above heat treatment is not limited to this timing; the heat treatment can be performed after the source electrode and the drain electrode are formed or after the protective insulating film is formed. Such treatment may be performed once or plural times.

Next, by a second photolithography step and an etching step, a first opening 110a and a first opening 110b are formed over the second gate electrode layer 102b and the first gate electrode layer 102a, respectively, in part of the semiconductor film 108 and the gate insulating layer 106. Here, the first opening 110a is used later for connecting the first source or drain electrode layer 112b of the first transistor 151 to the second gate electrode 102b. The first opening 110b formed in an FPC connection portion is used to expose the first gate electrode layer 102a (see FIG. 4C).

Here, the etching of the semiconductor film 108 and the gate insulating layer 106 may be either dry etching or wet etching. Alternatively, both of them may be used. As an etchant used for wet etching of the semiconductor film 108 which is an oxide semiconductor, for example, a mixed solution of phosphoric acid, acetic acid, and nitric acid can be used. Alternatively, ITO-07N (produced by KANTO CHEMICAL CO., INC.) may be used. As an etchant used for the gate insulating layer 106, a hydrofluoric acid-based etchant can be used.

Next, a second conductive film 112 to be a source or drain electrode layer (including a wiring formed in the same layer as the source electrode layer and the drain electrode layer) is formed over the second gate electrode layer 102b, the first gate electrode layer 102a, and the semiconductor film 108 (see FIG. 5A).

As the second conductive film 112, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, a film of a high-melting-point metal such as titanium, molybdenum, or tungsten or a nitride film of any of them (e.g., a titanium nitride film, a molybdenum nitride film, or a tungsten nitride film) may be stacked over one surface or both surfaces of a metal film such as an aluminum film or a copper film. For example, a stack of tungsten and copper, a stack of tungsten, tungsten nitride, copper, and tungsten, a stack of molybdenum, molybdenum nitride, copper, and molybdenum, a stack of molybdenum, aluminum, and molybdenum, or the like is used. In this embodiment, a stack in which copper is stacked over tungsten is used.

Next, a resist mask is formed over the second conductive film 112 by a third photolithography step and selective etching is performed so that the first source and drain electrode layers 112a and 112b and the second source and drain electrode layers 112c and 112d are formed. In addition, in the capacitor, the power source wiring (the second source or drain electrode layer 112c) is formed so as to overlap with the second gate electrode with the gate insulating layer 106 and the semiconductor film 108 provided therebetween. Further, in the FPC connection portion, a conductive layer 112e electrically connected to the first gate electrode layer 102a is formed (see FIG. 5B).

Note that the etching of the second conductive film 112 is performed so that the semiconductor film 108 is not etched as much as possible. However, it is difficult to obtain etching conditions under which only the second conductive film 112 is etched. In some cases, the semiconductor film 108 is partly etched so as to have a groove portion (a recessed portion) by the etching of the second conductive film 112.

Through the above process, the first transistor 151, the second transistor 152, and the capacitor 153 are formed. The transistors include the oxide semiconductor which is highly purified by intentionally removing impurities such as hydrogen, moisture, a hydroxyl group, and hydride (also referred to as a hydrogen compound) from the semiconductor film 108. Therefore, variation in the electric characteristics of the transistors is suppressed and the transistors are electrically stable.

Next, the protective insulating layer 114 is formed so as to cover the above components formed over the substrate 100 (see FIG. 5C). The protective insulating layer 114 can be formed with a thickness of at least 1 nm using, as appropriate, the above method by which impurities such as water and hydrogen are not mixed into the protective insulating layer 114 as much as possible. In this embodiment, the protective insulating layer 114 is formed by a sputtering method. When hydrogen is contained in the protective insulating layer 114, the hydrogen might enter the semiconductor film 108 or oxygen might be extracted from the semiconductor film 108 by the hydrogen. If such a phenomenon is caused, the resistance of the semiconductor film 108 on the backchannel side might be decreased (the semiconductor film 108 on the backchannel side might have n-type conductivity) and a parasitic channel might be formed. Therefore, it is important that the protective insulating layer 114 contain hydrogen as little as possible.

The protective insulating layer 114 can be formed by a PVD method, a CVD method, or the like. The protective insulating layer 114 can be formed so as to have a single-layer structure or a stacked-layer structure using a material including an inorganic insulating material such as silicon oxide, silicon oxynitride, silicon nitride, hafnium oxide, aluminum oxide, gallium oxide, or gallium aluminum oxide.

It is preferable that an insulating material containing the same kind of component as the semiconductor film 108 be used for the protective insulating layer 114, in a manner similar to that of the gate insulating layer 106. Such a material enables the state of the interface with the semiconductor film 108 to be kept well. For example, in the case where the semiconductor film 108 is formed using an In—Ga—Zn—O-based oxide semiconductor material, gallium oxide or the like is given as such an insulating material containing the same kind of component as the semiconductor film 108.

In the case where the protective insulating layer 114 has a stacked-layer structure, it is further preferable to employ a stacked-layer structure of an insulating film containing the same kind of component as the semiconductor film 108 (hereinafter referred to as a film a) and a film containing a material different from the component material of the film a (hereinafter referred to as a film b). The reason is as follows. When the protective insulating layer 114 has such a structure in which the film a and the film b are sequentially stacked from the semiconductor film 108 side, charge is trapped preferentially in a charge trapping center at the interface between the film a and the film b (compared with the interface between the semiconductor film 108 and the film a). Thus, trapping of charge at the interface with the semiconductor film 108 can be sufficiently suppressed, resulting in higher reliability of the transistors.

For example, a stacked-layer structure in which a gallium oxide film and a silicon oxide film are stacked from the semiconductor film 108 side, or a stacked-layer structure in which a gallium oxide film and a silicon nitride film are stacked from the semiconductor film 108 side is preferably used as the protective insulating layer 114.

In this embodiment, a silicon oxide film is used for the protective insulating layer 114. The silicon oxide film can be formed by a sputtering method using a rare gas, oxygen, or a mixed gas of a rare gas and oxygen. The substrate temperature in film formation may be higher than or equal to room temperature and lower than or equal to 300° C. and, in this embodiment, is 100° C. Further, a silicon oxide target or a silicon target can be used as a target. For example, the silicon oxide film can be formed with the use of a silicon target and oxygen as a sputtering gas.

In order to remove moisture remaining in the film formation chamber in formation of the protective insulating layer 114 in a manner similar to that of the formation of the semiconductor film 108, an entrapment vacuum pump (such as a cryopump) is preferably used. In the film formation chamber which is evacuated with a cryopump, for example, a hydrogen atom, a compound containing a hydrogen atom such as water, a compound containing a carbon atom, or the like are evacuated, whereby the impurity concentration in the formed protective insulating layer 114 can be reduced. In addition, as an evacuation unit for removing moisture remaining in the film formation chamber, a turbo molecular pump to which a cold trap is added may be used.

It is preferable to use a high-purity gas from which impurities such as hydrogen, water, a hydroxyl group, or hydride are removed as the sputtering gas when the protective insulating layer 114 is formed.

The second heat treatment may be performed after the formation of the protective insulating layer 114. The method and atmosphere of the heat treatment can be similar to those of the first heat treatment described above. The maximum temperature of the heat treatment varies depending on materials used for the gate electrode layer and the source and drain electrode layers, which is similar to the first heat treatment. In the case where the gate electrode layer and the source and drain electrode layers are formed using a metal having higher melting point such as copper, molybdenum, and tungsten, the maximum temperature can be set to 450° C. On the other hand, in the case where the gate electrode layer and the source and drain electrode layers are formed using a metal having lower melting point such as aluminum, the maximum temperature can be set to 380° C. Furthermore, the heat treatment may be performed at higher than or equal to 100° C. and lower than or equal to 200° C. for longer than or equal to 1 hour and shorter than or equal to 30 hours in the air. This heat treatment may be performed at a fixed temperature once. Alternatively, the following change in temperature may be conducted plural times: the temperature is increased from room temperature to a temperature higher than or equal to 100° C. and lower than or equal to 200° C. and then decreased to room temperature.

In the case where the heat treatment is performed in the state where the semiconductor film 108 is in contact with the protective insulating layer 114 containing oxygen, oxygen can be further supplied to the semiconductor film 108 from the protective insulating layer 114 containing oxygen.

Next, a planarization insulating layer 116 is formed over the protective insulating layer 114 (see FIG. 6A). It is preferable to form the planarization insulating layer 116 using an organic resin such as acrylic, polyimide, or polyamide, or siloxane.

When a photosensitive resin is used as the resin, a photo resist is not necessary and a desired shape can be formed by light exposure, so that the process can be simplified. Further, the photosensitive resin which is cured to a desired shape by light exposure can be used as a resist mask.

In this embodiment, a photosensitive acrylic resin is used for the planarization insulating layer 116 and is processed into an opening by light exposure (a fourth photolithography step). After that, the photosensitive acrylic resin is used as a mask to etch the protective insulating layer 114 and the semiconductor film 108, whereby the second opening 130a and the third opening 130b are formed (see FIG. 6B).

For the above etching step, wet etching, dry etching, or both of them may be employed. As an etchant used for wet etching, for example, a mixed solution of phosphoric acid, acetic acid, and nitric acid can be used. Alternatively, ITO-07N (produced by KANTO CHEMICAL CO., INC.) may be used. Further, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching. As the dry etching method, a parallel plate RIE (reactive ion etching) method or an ICP (inductively coupled plasma) etching method can be used.

The second opening 130a is formed by etching the protective insulating layer 114 and the semiconductor film 108. Here, unnecessary regions of the semiconductor film 108 are removed, so that the semiconductor layer 108a is formed. Therefore, a step such as processing a semiconductor film into an island shape can be omitted. That is, the number of photolithography steps can be reduced.

The third opening 130b is formed by etching only the protective insulating layer 114 because the second source or drain electro layer 112d and the conductive layer 112e below the protective insulating layer 114 serve as etching stoppers.

According to the manufacturing method described in this embodiment, since a photoresist is not formed directly over the semiconductor layer 108a, the contamination of the semiconductor layer 108a is not caused in separation and cleaning steps of the photoresist; thus, change in an electrical characteristic of the transistor can be suppressed.

Next, a third conductive film is formed so as to cover the third opening 130b. In this embodiment, the first transistor 151 and the second transistor 152 are n-channel transistors using an oxide semiconductor as the semiconductor layer 108a. For the third conductive film to be the first pixel electrode layer 118, a material serving as a cathode of the light-emitting element is preferably used. Specifically, as a cathode, a material with low work function, such as Ca, Al, CaF, MgAg, or AlLi, can be used. Note that a light-transmitting conductive film may be used for the third conductive film in order to control a direction of light emission. In this case, the above material serving as the cathode may be formed over the light-transmitting conductive film. As the light-transmitting conductive film, a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used. Alternatively, a material formed of 1 to 10 graphene sheets (corresponding to one layer of graphite) may be used.

Next, a resist mask is formed over the third conductive film by a fifth photolithography step and selective etching is performed so that a first pixel electrode layer 118 is formed. At this time, the first pixel electrode layer 118 may be formed in the second opening. Note that when an oxide conductive layer including ITO or the like is used as the third conductive film, in the FPC connection portion, an increase in contact resistance between an FPC terminal and the underlying metal conductive layer due to oxidation of a surface of the metal conductive layer can be suppressed, whereby reliability of the semiconductor device can be improved.

Next, a partition wall 119 is formed so as to surround the second opening 130a, the third opening 130b, and the first pixel electrode layer 118 (see FIG. 6C).

Next, the EL layer and the second pixel electrode layer are formed over the first pixel electrode layer 118, which is not illustrated.

Through the manufacturing method including the above process, the light-emitting display device can be manufactured. As a structure formed by a method different from the above, in a structure in which the capacitor 153 is not formed, the second gate electrode layer 102b is not formed in a region where the capacitor is formed in FIG. 4A.

In addition, a structure in which the planarization insulating layer 116 is not formed may be formed. In the manufacturing method of this structure, steps up to and including the step shown in FIG. 5C are performed similarly. After these steps, a second opening 120a and a third opening 120b are formed by a fourth photolithography step (see FIG. 7A).

Then, a third conductive film is formed over the protective insulating layer 114 so as to cover at least the third opening 120b, a resist mask is formed over the third conductive film by a fifth photolithography step and is etched selectively, whereby the first pixel electrode layer 118 is formed. At this time, the first pixel electrode layer 118 may be formed in part of the second opening 120a.

Next, the partition wall 119 is formed so as to surround the second opening 120a, the third opening 120b, and the first pixel electrode layer 118 (see FIG. 7B).

Through the above, the step of forming the openings in the protective insulating layer 114 and the step of removing the unnecessary portions of the semiconductor film 108 are performed at the same time; therefore, a manufacturing method of the light-emitting display device in which the number of photolithography steps is reduced can be provided.

Note that this embodiment can be freely combined with any of the other embodiments.

Embodiment 2

Figure 8A:
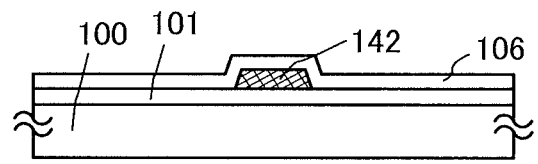
FIGS. 8A to 8C are cross-sectional views illustrating one embodiment of a method for manufacturing a light-emitting display device.
Figure 8B:
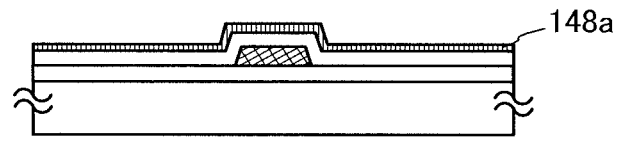
Figure 8C:
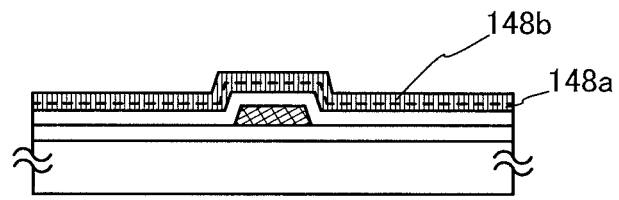

In this embodiment, an example of a process which is partly different from that described in Embodiment 1 will be described with reference to FIGS. 8A to 8C. Note that in FIGS. 8A to 8C, the same reference numerals are used for the same parts as those in FIGS. 4A to 4C, and description of the parts with the same reference numerals is omitted here.

First, as in Embodiment 1, a conductive film is formed over the substrate 100 having an insulating surface, and then, the gate electrode layer 142 is formed through a first photolithography step and an etching step.

An insulating film serving as a base film may be formed between the substrate 100 and the gate electrode layer; in this embodiment, a base film 101 is provided. The base film 101 has a function of preventing diffusion of impurity elements (e.g., Na) from the substrate 100 and can be formed from a film selected from a silicon oxide film, a silicon oxynitride film, a silicon nitride film, a hafnium oxide film, an aluminum oxide film, a gallium oxide film, and a gallium aluminum oxide film. The structure of the base film is not limited to a single-layer structure, and may be a layered structure of a plurality of the above films.

In this embodiment, a film formation temperature of a semiconductor film to be subsequently formed is higher than or equal to 200° C. and lower than or equal to 450° C. and a temperature of heat treatment after the formation of the semiconductor film is higher than or equal to 200° C. and lower than or equal to 450° C.; therefore, as materials of the gate electrode layer 142, a stacked-layer structure in which copper is used for a lower layer and molybdenum is used for an upper layer or a stacked-layer structure in which copper is used for a lower layer and tungsten is used for an upper layer is employed.

Next, in a manner similar to that of Embodiment 1, the gate insulating layer 106 is formed over the gate electrode layer 142 by a CVD method, a sputtering method, or the like. FIG.

8A is a cross-sectional view illustrating the structure obtained through the steps up to and including this step.

Next, a first oxide semiconductor film having a thickness of greater than or equal to 1 nm and less than or equal to 10 nm is formed over the gate insulating layer 106. In this embodiment, the first oxide semiconductor film having a thickness of 5 nm is formed under an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed by setting an atmosphere where the substrate is placed to a nitrogen atmosphere or dry air. The temperature of the first heat treatment is higher than or equal to 200° C. and lower than or equal to 450° C. In addition, heating time of the first heat treatment is longer than or equal to 1 hour and shorter than or equal to 24 hours. By the first heat treatment, a first crystalline oxide semiconductor layer 148a is formed (see FIG. 8B).

Then, a second oxide semiconductor film having a thickness greater than 10 nm is formed over the first crystalline oxide semiconductor layer 148a. In this embodiment, the second oxide semiconductor film having a thickness of 25 nm is formed under an oxygen atmosphere, an argon atmosphere, or an atmosphere including argon and oxygen under conditions where an In—Ga—Zn—O-based oxide semiconductor target ($In_2O_3$:$Ga_2O_3$:ZnO=1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed by setting an atmosphere where the substrate is placed to a nitrogen atmosphere or dry air. The temperature of the second heat treatment is higher than or equal to 200° C. and lower than or equal to 450° C. In addition, heating time of the second heat treatment is longer than or equal to 1 hour and shorter than or equal to 24 hours. By the second heat treatment, a second crystalline oxide semiconductor layer 148b is formed (see FIG. 8C).

In the subsequent steps, the second conductive film 112, the protective insulating layer 114, and the like are formed in accordance with Embodiment 1. The protective insulating layer 114, the first crystalline oxide semiconductor layer 148a, and the second crystalline oxide semiconductor layer 148b are etched with one resist mask so that the number of photolithography steps is reduced.

In this manner, the structure including the first transistor 151 and the second transistor 152 illustrated in FIG. 6B can be obtained in accordance with Embodiment 1. Note that in the case where this embodiment is employed, the semiconductor layer including channel formation regions of such transistors has a stacked-layer structure of the first crystalline oxide semiconductor layer 148a and the second crystalline oxide semiconductor layer 148b. The first crystalline oxide semiconductor layer 148a and the second crystalline oxide semiconductor layer 148b are crystalline oxide semiconductors having c-axis alignment.

The crystalline oxide semiconductor is an oxide including a crystal with c-axis alignment (also referred to as C-Axis Aligned Crystal (CAAC)), which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

Note that the CAAC is not limited to such a stacked-layer structure of the first crystalline oxide semiconductor layer 148a and the second crystalline oxide semiconductor layer 148b and can also have a single-layer structure.

Note that in order to form a CAAC, it is preferable that the planarity of the surface of a layer that serves as a base be improved as much as possible by CMP or the like and an average surface roughness thereof be made smaller than or equal to that of a thermal oxide film. The crystallinity and continuity of a crystal included in a CAAC can be improved by forming the CAAC over a layer having high surface planarity.

Further, it is preferable that the first oxide semiconductor film and the second crystalline oxide semiconductor film be formed using a sputtering gas in which the flow rate of oxygen is improved. For example, in the case where argon and oxygen are used as the sputtering gas, the crystallinity of a crystal included in a CAAC can be improved and an oxygen deficiency in the films can be compensated by setting the oxygen flow rate to higher than or equal to 30%. Further, when the film formation is performed at a temperature of higher than or equal to 150° C., the crystallinity of a crystal included in a CAAC can be further improved.

After each film is formed, the heat treatment is performed under a nitrogen atmosphere or under a reduced pressure. After that, heat treatment is performed under an oxygen atmosphere or a mixed atmosphere of nitrogen and oxygen, so that the CAAC can contain oxygen excessively and thus the oxygen deficiency can be compensated effectively. Note that the heat treatment is preferably performed at a temperature of approximately 450° C.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 16A to 16E, FIGS. 17A to 17C, and FIGS. 18A to 18C. In FIGS. 16A to 16E, FIGS. 17A to 17C, and FIGS. 18A to 18C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 16A:
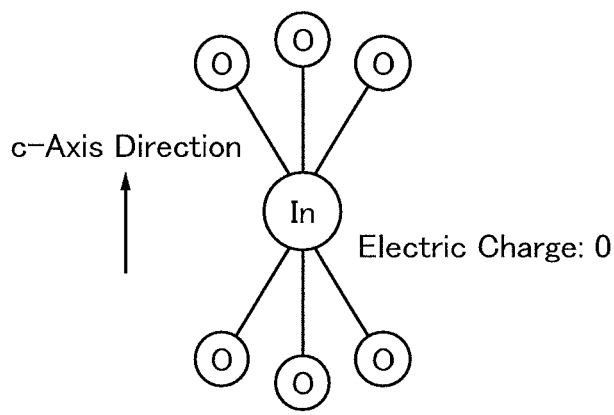
FIGS. 16A to 16E are diagrams illustrating structures of oxide materials.

FIG. 16A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 16A is actually an octahedral structure, but is illustrated as a planar structure for simplicity. Note that three tetracoordinate O atoms exist in each of an upper half and a lower half in FIG. 16A. In the small group illustrated in FIG. 16A, electric charge is 0.

Figure 16D:
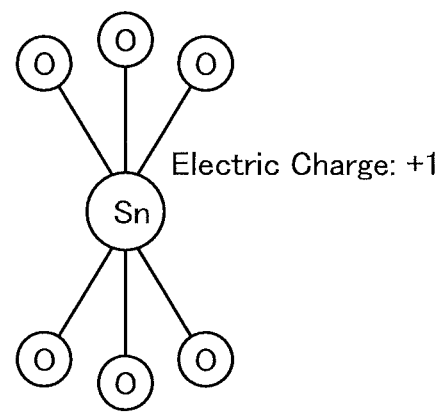
Figure 16B:
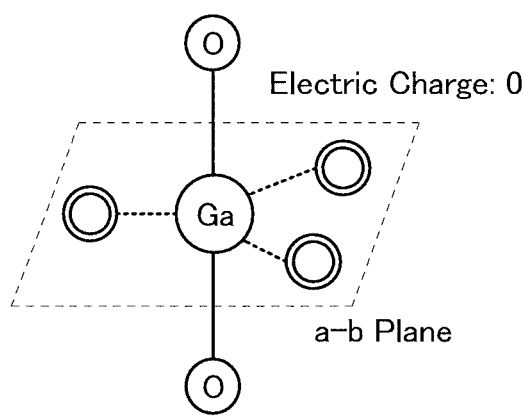

FIG. 16B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 16B. An In atom can also have the structure illustrated in FIG. 16B because an In atom can have five ligands. In the small group illustrated in FIG. 16B, electric charge is 0.

Figure 16E:
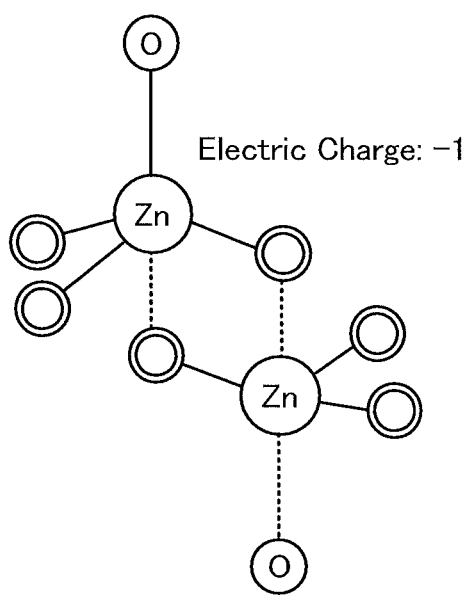
Figure 16C:
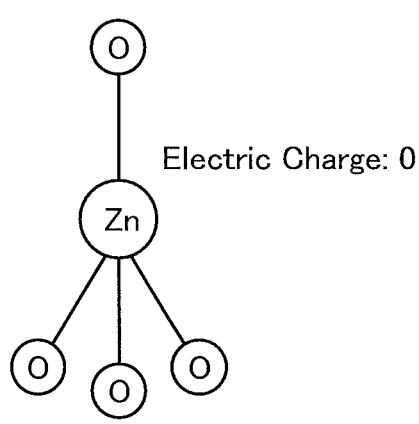

FIG. 16C illustrates a structure including one tetracoordinate Zn atom and four tetracoordinate O atoms proximate to the Zn atom. In FIG. 16C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 16C. In the small group illustrated in FIG. 16C, electric charge is 0.

FIG. 16D illustrates a structure including one hexacoordinate Sn atom and six tetracoordinate O atoms proximate to the Sn atom. In FIG. 16D, three tetracoordinate O atoms exist in each of an upper half and a lower half. In the small group illustrated in FIG. 16D, electric charge is +1.

FIG. 16E illustrates a small group including two Zn atoms. In FIG. 16E, one tetracoordinate O atom exists in each of an upper half and a lower half. In the small group illustrated in FIG. 16E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 16A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 17A:
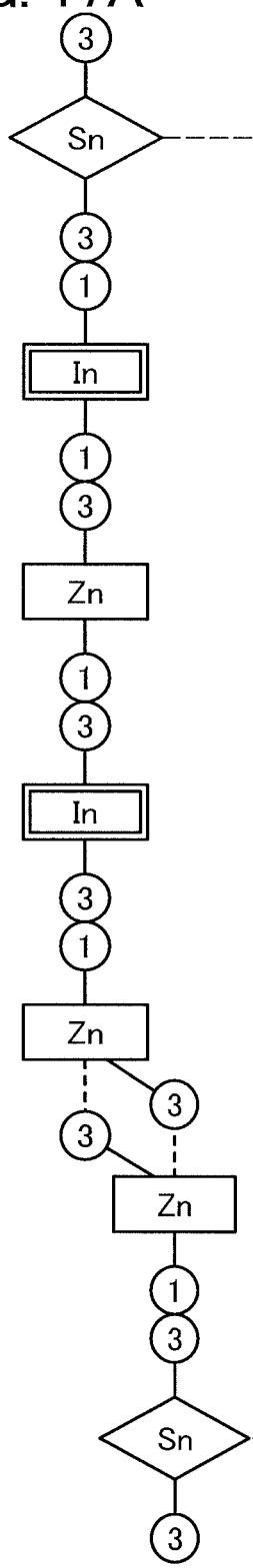
FIGS. 17A to 17C illustrate a structure of an oxide material.
Figure 17B:
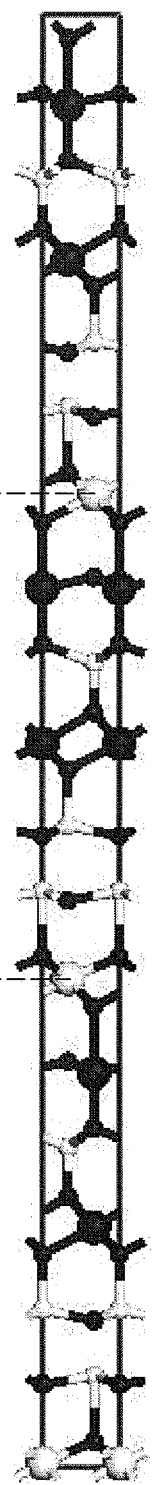
Figure 17C:
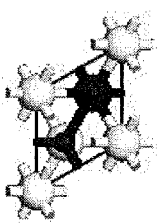

FIG. 17A illustrates a model of a medium group included in a layered structure of an In—Sn—Zn—O-based material. FIG. 17B illustrates a large group including three medium groups. Note that FIG. 17C illustrates an atomic arrangement in the case where the layered structure in FIG. 17B is observed from the c-axis direction.

In FIG. 17A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 17A, one tetracoordinate O atom existing in each of an upper half and a lower half with respect to an In atom is denoted by circled 1. FIG. 17A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 17A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 16E can be given. For example, with one small group including two Zn atoms, electric charge of one small group including a Sn atom can be cancelled, so that the total electric charge of the layered structure can be 0.

When the large group illustrated in FIG. 17B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

For example, FIG. 18A illustrates a model of a medium group included in a layered structure of an In—Ga—Zn—O-based material.

In the medium group included in the layered structure of the In—Ga—Zn—O-based material in FIG. 18A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 18B illustrates a large group including three medium groups. Note that FIG. 18C illustrates an atomic arrangement in the case where the layered structure in FIG. 18B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 18A but also a medium group in which the arrangement of the In atom, the Ga atom, and the Zn atom is different from that in FIG. 18A.

When the large group illustrated in FIG. 18B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 19A:
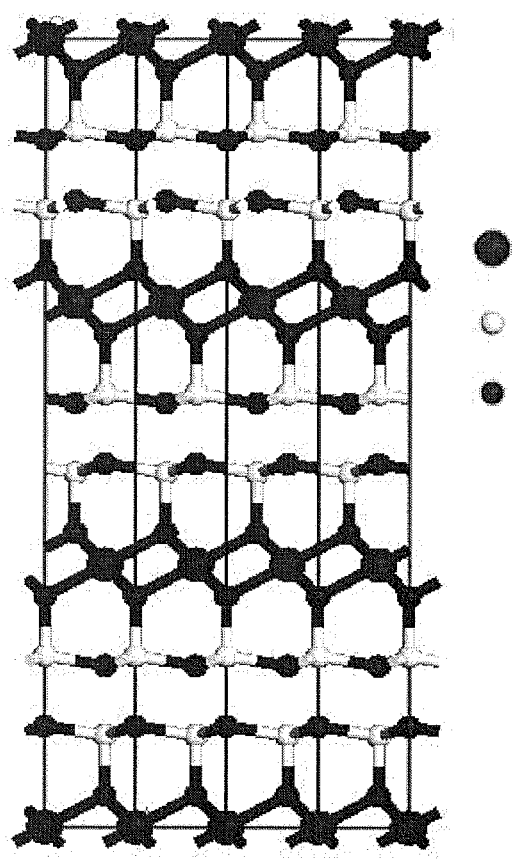
FIGS. 19A and 19B illustrate structures of oxide materials.

In the case where n=1 ($InGaZnO_4$), a crystal structure illustrated in FIG. 19A can be obtained, for example. Note that in the crystal structure in FIG. 19A, since a Ga atom and an In atom each have five ligands as illustrated in FIG. 16B, a structure in which Ga is replaced with In can be obtained.

Figure 19B:
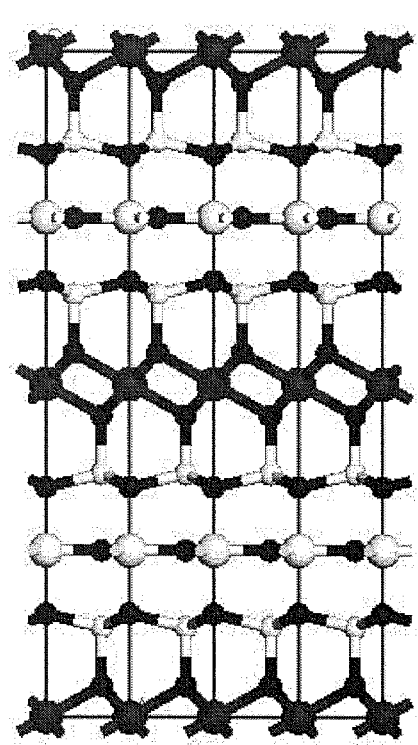

In the case where n=2 ($InGaZn_2O_5$), a crystal structure illustrated in FIG. 19B can be obtained, for example. Note that in the crystal structure in FIG. 19B, a Ga atom and an In atom each have five ligands as described in FIG. 16B, a structure in which Ga is replaced with In can be obtained.

With the use of the above CAAC for a transistor, the amount of shift of the threshold voltage of the transistor, which occurs by light irradiation and a bias-temperature (BT) stress test, can be reduced.

Note that this embodiment can be freely combined with any of the other embodiments.

Embodiment 3

In this embodiment, an example of a light-emitting display device in one embodiment of the present invention will be described. As a display element included in the display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, so that current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

The light-emitting display device described in this embodiment has the pixel portion described in Embodiment 1 and includes the substrate 100, the first transistor 151, the second transistor 152, the protective insulating layer 114, the planarization insulating layer 116, the partition wall 119, and the first pixel electrode layer 118 which is used for a light-emitting element (see FIGS. 1A and 1B). Further, an EL layer and a second pixel electrode layer are formed over the first pixel electrode layer 118.

Since the first transistor 151 and the second transistor 152 for the pixel are n-channel transistors in this embodiment, a cathode is preferably used for the first pixel electrode layer 118. Specifically, as a cathode, a material with low work function, such as Ca, Al, CaF, MgAg, or AlLi, can be used.

The partition wall 119 is formed using an organic resin film, an inorganic insulating film, or organic polysiloxane. It is particularly preferable that the partition wall 119 be formed using a photosensitive material; an opening be formed over the first pixel electrode layer 118; and a side surface of the opening have an inclined surface with a continuous curvature.

Note that the EL layer may be formed using a single layer or a plurality of layers stacked.

The second electrode layer used as an anode is formed to cover the EL layer. The second pixel electrode layer can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon is added. Alternatively, a material formed of 1 to 10 graphene sheets (corresponding to one layer of graphite) may be used. The second pixel electrode layer may also be formed using a titanium nitride film or a titanium film instead of the above light-transmitting conductive film. The light-emitting element is formed by overlapping of the first pixel electrode layer 118, the EL layer, and the second pixel electrode layer. After that, a protective film may be formed over the second pixel electrode layer and the partition wall 119 in order to prevent entry of oxygen, hydrogen, moisture, carbon dioxide, or the like into the light-emitting element. As the protective film, a silicon nitride film, a silicon nitride oxide film, a DLC film, or the like can be formed.

Furthermore, it is preferable that the display device be packaged (sealed) with a protective film (such as a laminate film or an ultraviolet curable resin film) or a cover material with high air-tightness and little degasification so that the display device is not exposed to the outside air.

Next, structures of the light-emitting element will be described with reference to FIGS. 9A to 9C. Note that FIGS. 9A to 9C are each a cross-sectional view in which the EL layer, the second pixel electrode layer, and the like are added to the cross-sectional structure taken along line A2-A3 of FIG. 1A.

In a light-emitting element, it is acceptable as long as at least one of an anode and a cathode has a light-transmitting property in order to extract light emission. A transistor and a light-emitting element are formed over a substrate. A light-emitting element can have a top emission structure, in which light emission is extracted through the surface on the side opposite to the substrate side; a bottom emission structure, in which light emission is extracted through the surface on the substrate side; or a dual emission structure, in which light emission is extracted through the surface on the side opposite to the substrate side and the surface on the substrate side. The pixel structure according to one embodiment of the present invention can be applied to a light-emitting element having any of these emission structures.

A light-emitting element having a top emission structure will be described with reference to FIG. 9A.

Figure 9A:
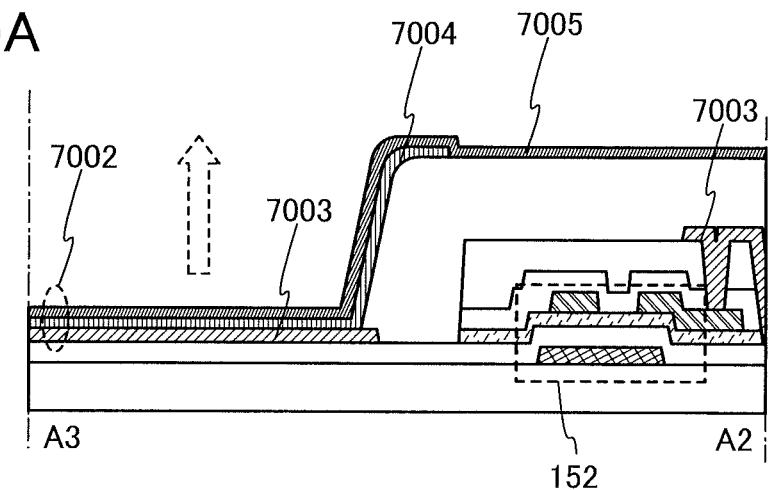
FIGS. 9A to 9C are cross-sectional views each illustrating a structure of a light-emitting element.
Figure 9B:
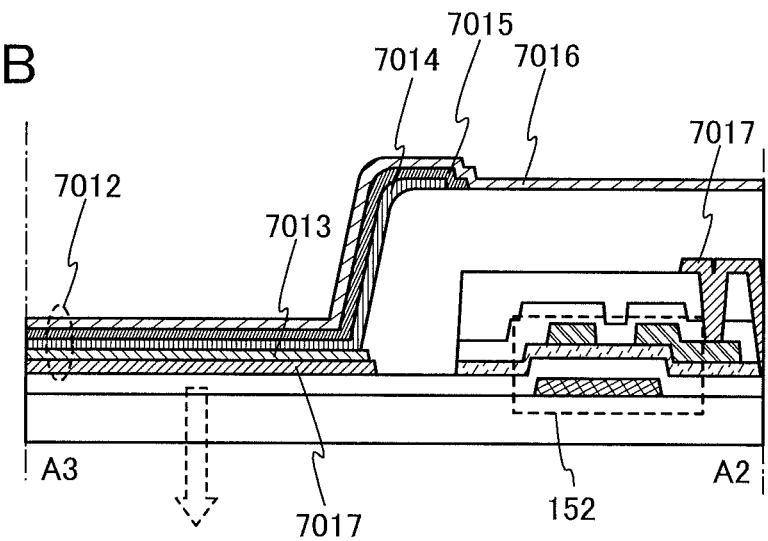
Figure 9C:
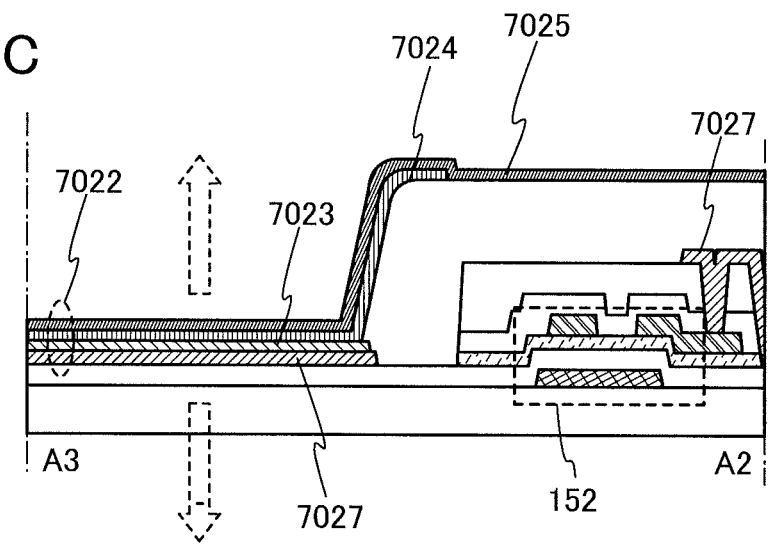

FIG. 9A is a cross-sectional view of a pixel in the case where the second transistor 152 is of an n-type transistor and light is emitted from a light-emitting element 7002 to an anode 7005 side. In FIG. 9A, a cathode 7003 of the light-emitting element 7002 is electrically connected to the second transistor 152, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. It is not necessary to form all of these layers. The anode 7005 may be formed using a light-transmitting conductive material; for example, a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon is added, or the like may be used. Alternatively, a material formed of 1 to 10 graphene sheets (corresponding to one layer of graphite) may be used.

The light-emitting element 7002 corresponds to a region where the light-emitting layer 7004 is sandwiched between the cathode 7003 and the anode 7005. In the case of the pixel illustrated in FIG. 9A, light is emitted from the light-emitting element 7002 to the anode 7005 side as indicated by an arrow.

Next, a light-emitting element having a bottom emission structure will be described with reference to FIG. 9B. FIG. 9B is a cross-sectional view of a pixel in the case where the second transistor 152 is of an n-channel transistor and light is emitted from a light-emitting element 7012 to a cathode 7013 side. In FIG. 9B, the cathode 7013 of the light-emitting element 7012 is formed over a light-transmitting conductive film 7017 which is electrically connected to the second transistor 152, and a light-emitting layer 7014 and an anode 7015 are stacked in this order over the cathode 7013. A light-blocking film 7016 for reflecting or blocking light may be formed to cover the anode 7015 when the anode has a light-transmitting property. For the cathode 7013, various materials can be used as in the case of FIG. 9A as long as they are conductive materials having a low work function. Note that the thickness is set so that light is transmitted therethrough (preferably, a thickness of greater than or equal to 5 nm and less than or equal to 30 nm). For example, an aluminum film having a thickness of 20 nm can be used as the cathode 7013. The light-emitting layer 7014 may be formed using either a single layer or a plurality of layers stacked as in the case of FIG. 9A. The anode 7015 is not required to transmit light, but can be formed using a light-transmitting conductive material as in the case of FIG. 9A. As the light-blocking film 7016, a metal or the like that reflects light can be used for example; however, it is not limited to a metal film. For example, a resin to which black colorant is added can also be used.

The light-emitting element 7012 corresponds to a region where the light-emitting layer 7014 is sandwiched between the cathode 7013 and the anode 7015. In the case of the pixel illustrated in FIG. 9B, light is emitted from the light-emitting element 7012 to the cathode 7013 side as indicated by an arrow.

Next, a light-emitting element having a dual emission structure will be described with reference to FIG. 9C. In FIG. 9C, a cathode 7023 of a light-emitting element 7022 is formed over a light-transmitting conductive film 7027 which is electrically connected to the second transistor 152, and a light-emitting layer 7024 and an anode 7025 are stacked in this order over the cathode 7023. For the cathode 7023, various materials can be used as in the case of FIG. 9A as long as they are conductive materials having a low work function. Note that the thickness is set so that light is transmitted therethrough. For example, an aluminum film having a thickness of 20 nm can be used as the cathode 7023. The light-emitting layer 7024 may be formed using either a single layer or a plurality of layers stacked as in the case of FIG. 9A. The anode 7025 can be formed using a light-transmitting conductive material as in the case of FIG. 9A.

The light-emitting element 7022 corresponds to a region where the cathode 7023, the light-emitting layer 7024, and the anode 7025 overlap with one another. In the case of the pixel illustrated in FIG. 9C, light is emitted from the light-emitting element 7022 to both the anode 7025 side and the cathode 7023 side as indicated by arrows.

Note that although the organic EL elements are described here as the light-emitting elements, an inorganic EL element can also be provided as a light-emitting element.

Figure 15A:
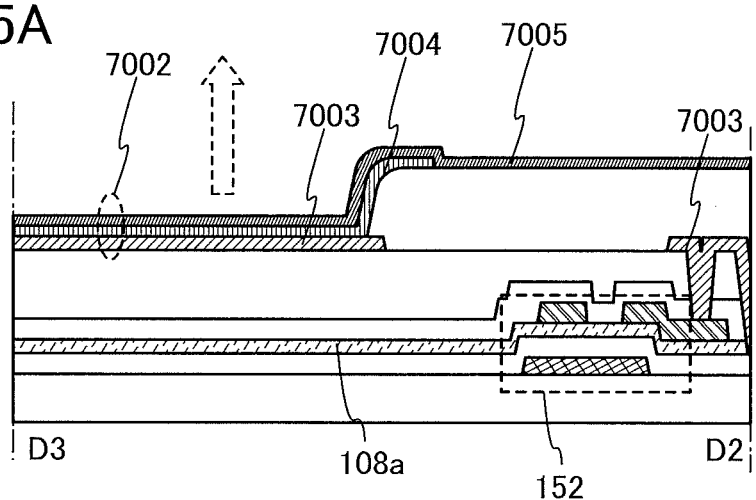
FIGS. 15A to 15C are cross-sectional views each illustrating a structure of a light-emitting element.
Figure 15B:
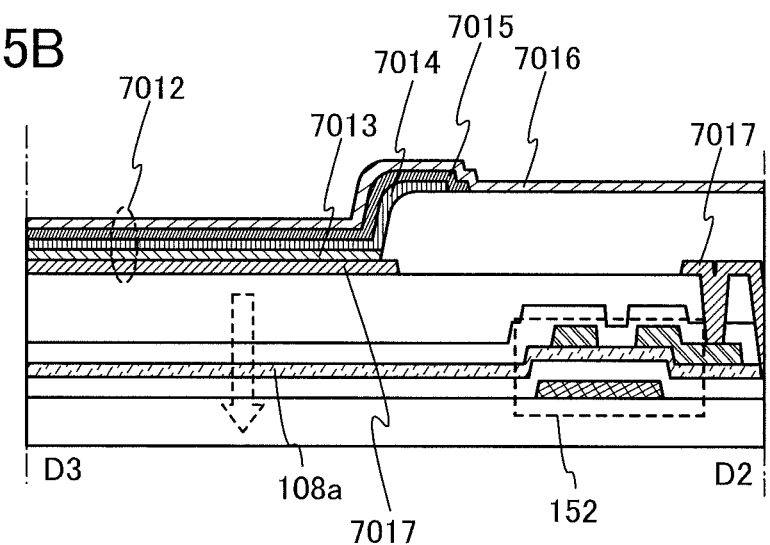
Figure 15C:
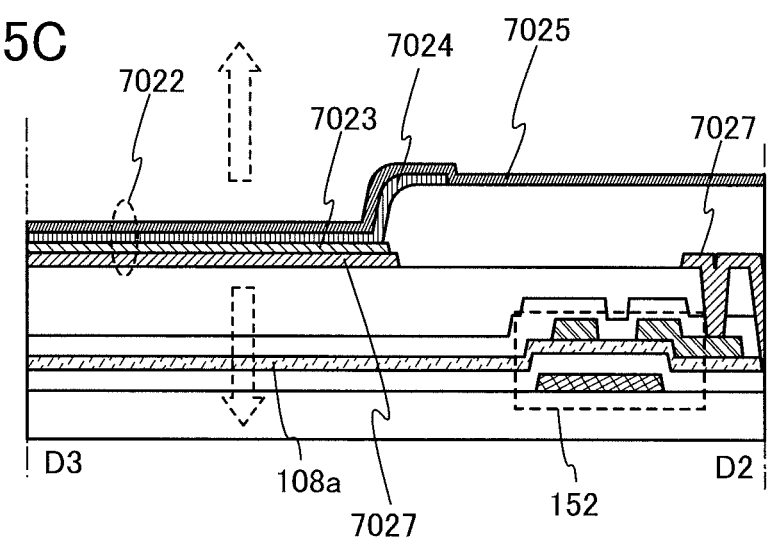

Further, even in a structure in which the semiconductor layer 108a is left in the entire pixel region illustrated in FIGS. 14A and 14B, which is described in Embodiment 1, light-emitting elements can have structures similar to those in FIGS. 9A to 9C. The structures of the light-emitting elements in this case are illustrated in FIGS. 15A to 15C. FIG. 15A is a top emission structure similar to FIG. 9A, FIG. 15B is a bottom emission structure similar to FIG. 9B, and FIG. 15C is a dual emission structure similar to FIG. 9C, and the detail descriptions for the above structures are the same as those of FIGS. 9A to 9C. Note that in the structures of FIGS. 15B and 15C, light can be transmitted in a bottom direction by using an oxide semiconductor layer, which has a light-transmitting property with respect to visible light, for the semiconductor layer 108a.

Note that the light-emitting display device described in this embodiment is not limited to the structures illustrated in FIGS. 9A to 9C or FIGS. 15A to 15C and can be modified in various ways based on the technical idea of the present invention.

Note that this embodiment can be freely combined with any of the other embodiments.

Embodiment 4

A light-emitting display device according to one embodiment of the present invention can be applied to a variety of electronic devices (including game machines). Examples of the electronic devices are a television set (also referred to as a television or a television receiver), a monitor of a computer or the like, a camera such as a digital camera or a digital video camera, a digital photo frame, a mobile phone set (also referred to as a mobile phone or a mobile phone device), a portable game machine, a portable information terminal, an audio reproducing device, and a large-sized game machine such as a pachinko machine.

Figure 10A:
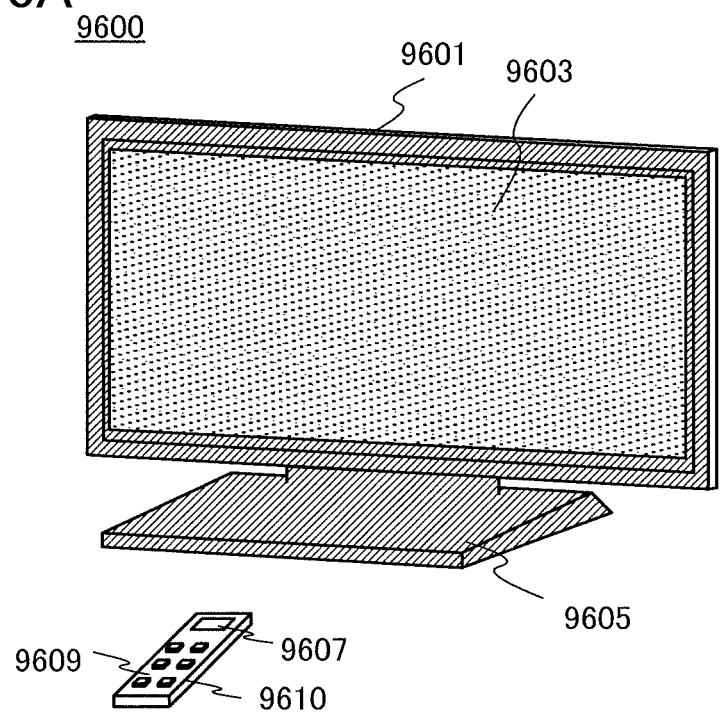
FIGS. 10A and 10B are diagrams each illustrating an electronic device.

FIG. 10A shows an example of a television set. In a television set 9600, a display portion 9603 is incorporated in a housing 9601. The display portion 9603 can display images. Here, the housing 9601 is supported by a stand 9605.

The television set 9600 can operate by an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Further, when the television set 9600 is connected to a communication network with or without wires via the modem, one-way (from a sender to a receiver) or two-way (between a sender and a receiver or between receivers) information communication can be performed.

Figure 10B:
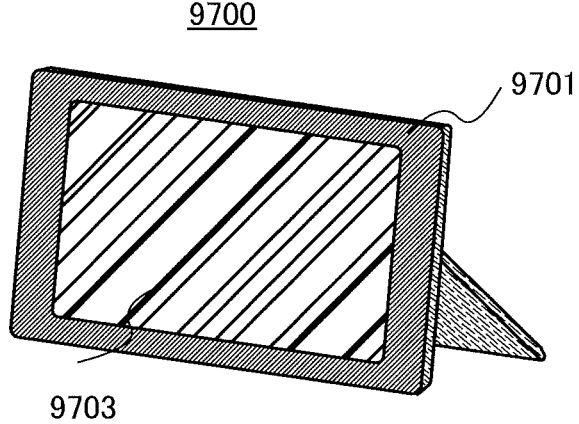

FIG. 10B shows an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may transmit and receive data wirelessly. The structure may be employed in which desired image data is transferred wirelessly to be displayed.

Figure 11A:
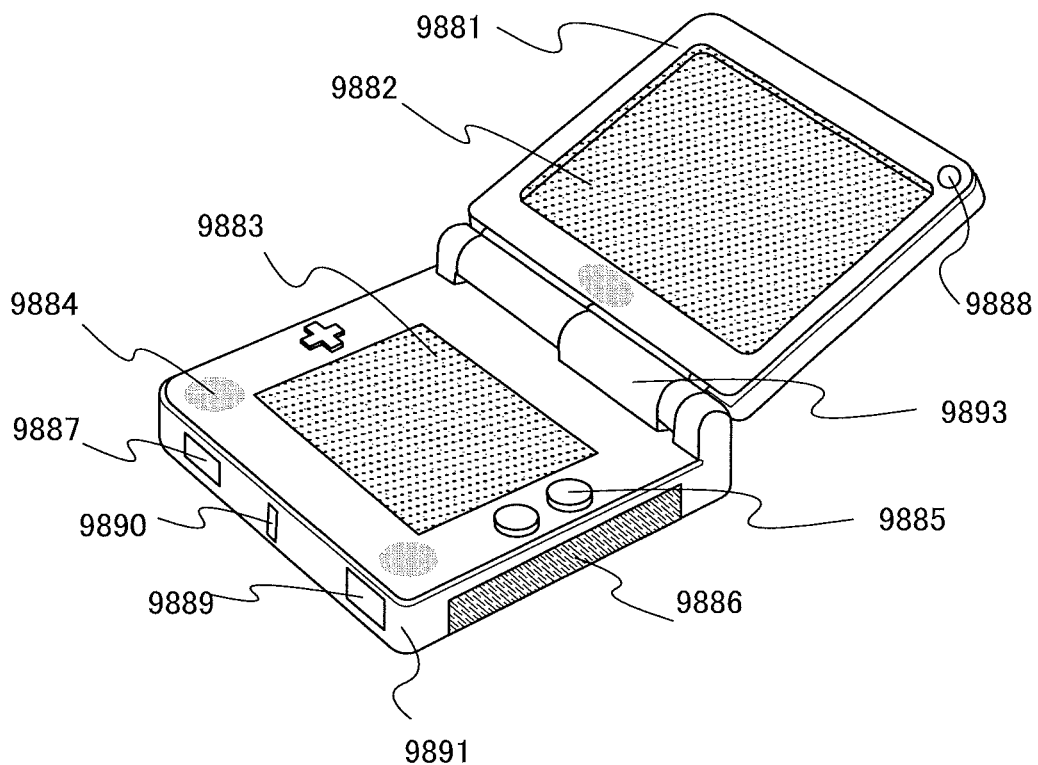
FIGS. 11A and 11B are diagrams each illustrating an electronic device.

FIG. 11A is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. The portable game machine illustrated in FIG. 11A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), and a microphone 9889), and the like. Needless to say, the structure of the portable game machine is not limited to the above, and another accessory may be provided as appropriate. The portable game machine illustrated in FIG. 11A has a function of reading out a program or data stored in a storage medium to display it on the display portion, and a function of sharing information with another portable game machine by wireless communication. Note that functions of the portable game machine illustrated in FIG. 11A are not limited to them, and the portable game machine can have various functions.

Figure 11B:
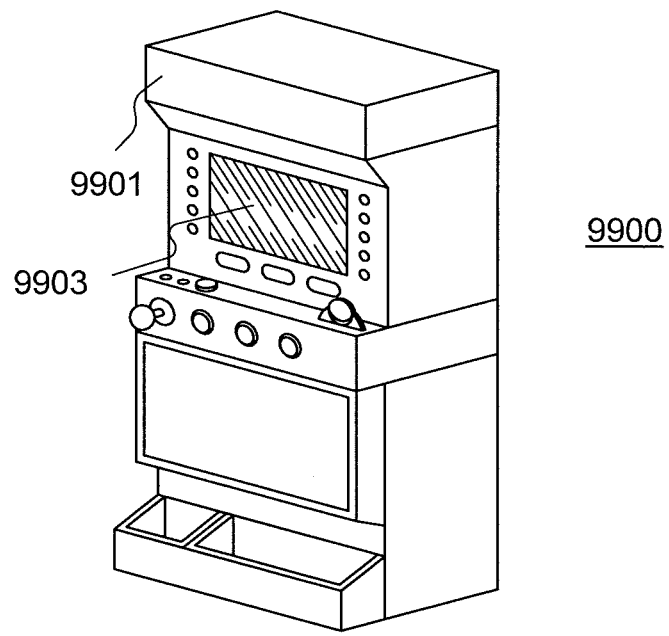

FIG. 11B shows an example of a slot machine which is a large-sized amusement machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above, and another accessory may be provided as appropriate.

Figure 12A:
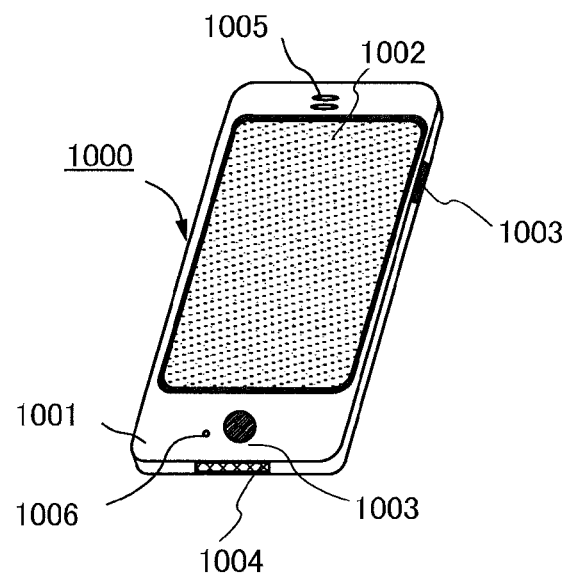
FIGS. 12A and 12B are diagrams each illustrating an electronic device.

FIG. 12A shows an example of a mobile phone set. A mobile phone set 1000 is provided with a display portion 1002 incorporated in a housing 1001, an operation button 1003, an external connection port 1004, a speaker 1005, a microphone 1006, and the like.

When the display portion 1002 of the mobile phone set 1000 illustrated in FIG. 12A is touched with a finger or the like, data can be input to the mobile phone set 1000. Users can make a call or send text by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case where a call or composing a mail is made, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone set 1000, display in the screen of the display portion 1002 can be automatically switched by determining the installation direction of the mobile phone set 1000 (whether the mobile phone set 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 12B:
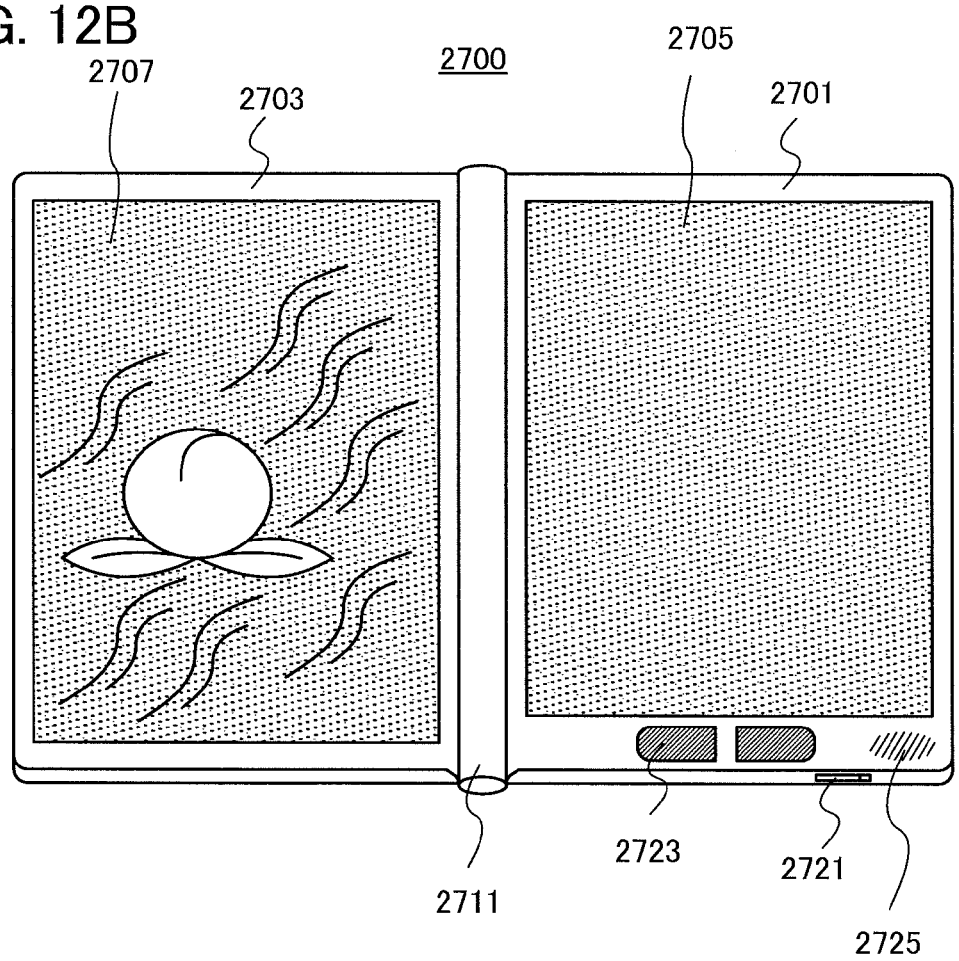

FIG. 12B shows an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 12B) and images can be displayed on a display portion on the left side (the display portion 2707 in FIG. 12B).

FIG. 12B shows an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, and the like may be provided on the same surface as the display portion of the housing. An external connection terminal (e.g., an earphone terminal, a USB terminal, or a terminal connectable to an AC adapter or a variety of cables such as a USB cable), a memory medium reading portion, or the like may be provided on the rear surface or the side surface of the housing 2701. Further, the e-book reader 2700 may have a function of an electronic dictionary.

The e-book reader 2700 may have a structure capable of wirelessly transmitting and receiving data. Through wireless communication, desired book data or the like can be purchased and downloaded from an electronic book server.

Note that this embodiment can be freely combined with any of the other embodiments.

Embodiment 5

In this embodiment, with the use of a light-emitting display device which switches an image for a left eye and an image for a right eye at high speed, an example in which a three-dimensional image which is a moving image or a still image is seen with dedicated glasses with which videos of the display device are synchronized will be described with reference to FIGS. 13A and 13B.

Figure 13A:
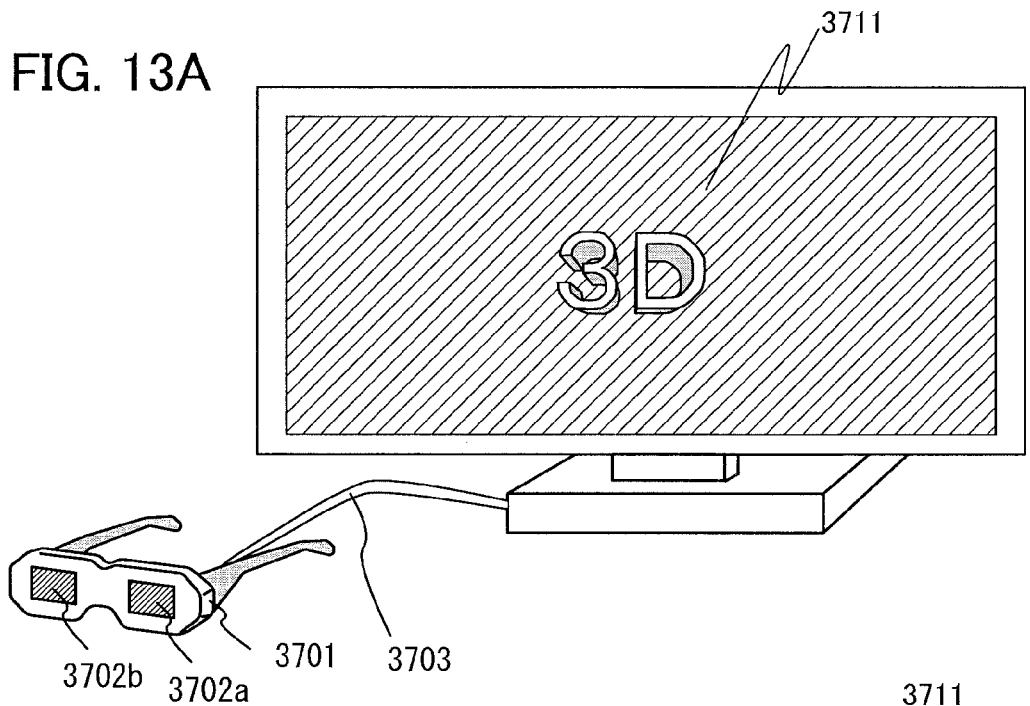
FIGS. 13A and 13B are diagrams illustrating an example of a device which shows a three-dimensional image which is a moving image or a still image with dedicated glasses with which an image of a display device is synchronized.

FIG. 13A is an external view in which a light-emitting display device 3711 and dedicated glasses 3701 are connected to each other with a cable 3703. In the dedicated glasses 3701, shutters provided in a panel 3702a for a left eye and a panel 3702b for a right eye are alternately opened and closed, whereby a user can see an image of the light-emitting display device 3711 as a three-dimensional image.

Figure 13B:
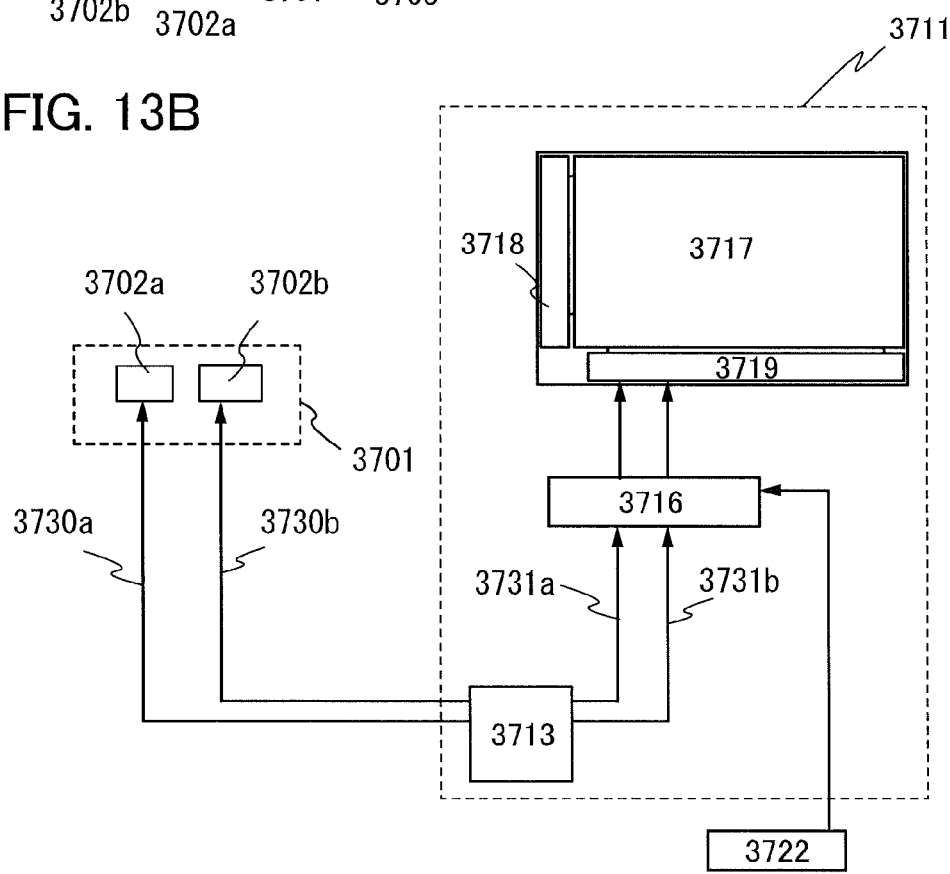

In addition, FIG. 13B is a block diagram illustrating a main structure of the light-emitting display device 3711 and the dedicated glasses 3701.

The light-emitting display device 3711 illustrated in FIG. 13B includes a display control circuit 3716, a display portion 3717, a timing generator 3713, a source line driver circuit 3718, an external operation unit 3722, and a gate line driver circuit 3719. Note that an output signal changes depending on operation by the external operation unit 3722 such as a keyboard.

In the timing generator 3713, a start pulse signal and the like are formed, and a signal for synchronizing an image for a left eye and the shutter of the panel 3702a for a left eye, a signal for synchronizing an image for a right eye and the shutter of the panel 3702b for a right eye, and the like are formed.

A synchronization signal 3731a of the image for a left eye is input to the display control circuit 3716, so that the image for a left eye is displayed on the display portion 3717. At the same time, a synchronization signal 3730a for opening the shutter of the panel 3702a for a left eye is input to the panel 3702a for a left eye. In addition, a synchronization signal 3731b of the image for a right eye is input to the display control circuit 3716, so that the image for a right eye is displayed on the display portion 3717. At the same time, a synchronization signal 3730b for opening the shutter of the panel 3702b for a right eye is input to the panel 3702b for a right eye.

Since an image for a left eye and an image for a right eye are switched at high speed, it is preferable to use a display panel which is driven with the frame frequency of, for example, 120 Hz or 240 Hz as the light-emitting display device 3711. Since the display panel is driven with the frame frequency of 120 Hz or 240 Hz, a light-emitting display panel using an organic EL element whose response speed is high is suitable for a display device which shows a three-dimensional image. Further, since the display panel is driven with the frame frequency of 120 Hz or 240 Hz, as the switching element, a transistor whose active layer is formed using an oxide semiconductor material having mobility higher than that of a transistor using amorphous silicon is appropriate.

Note that this embodiment can be freely combined with any of the other embodiments.

This application is based on Japanese Patent Application serial no. 2010-190850 filed with Japan Patent Office on Aug. 27, 2010, the entire contents of which are hereby incorporated by reference.

What is claimed is:

1. A method for manufacturing a semiconductor device comprising the steps of:
    forming a first conductive film over a substrate;
    forming a first resist mask over the first conductive film;
    forming a first gate electrode and a second gate electrode by selectively etching the first conductive film with the use of the first resist mask;
    forming a first insulating film over the first gate electrode and the second gate electrode;
    forming a semiconductor film over the first insulating film;
    forming a second resist mask over the semiconductor film;
    forming a first opening by selectively etching part of the semiconductor film and the first insulating film over the second gate electrode with the use of the second resist mask;
    forming a second conductive film so as to cover the semiconductor film and the first opening;
    forming a third resist mask over the second conductive film;
    forming a first source electrode, a first drain electrode, a second source electrode and a second drain electrode by selectively etching the second conductive film with the use of the third resist mask,
    wherein a first transistor comprises the first gate electrode, the first source electrode and the first drain electrode,
    wherein a second transistor comprises the second gate electrode, the second source electrode and the second drain electrode,
    wherein one of the first source electrode and the first drain electrode is electrically connected to a source or drain wiring,
    wherein the other of the first source electrode and the first drain electrode is electrically connected to the second gate electrode, and
    wherein one of the second source electrode and the second drain electrode is electrically connected to a power source wiring;
    forming a second insulating film over the first source electrode and the first drain electrode, the second source electrode and the second drain electrode, and the semiconductor film;
    forming a fourth resist mask over the second insulating film;
    forming a second opening by selectively etching the second insulating film and the semiconductor film with the use of the fourth resist mask and simultaneously forming a third opening in the second insulating film so as to expose part of the other of the second source electrode and the second drain electrode;
    forming a third conductive film over the second insulating film so as to cover the third opening;
    forming a fifth resist mask over the third conductive film; and
    forming a pixel electrode by selectively etching the third conductive film with the use of the fifth resist mask.

2. The method for manufacturing a semiconductor device according to claim 1 further comprising the steps of:
    forming a third insulating film so as to cover the second opening, the third opening, and a periphery of the pixel electrode; and
    forming a layer including a light-emitting element over the pixel electrode.

3. The method for manufacturing a semiconductor device according to claim 1, wherein the semiconductor film is an oxide semiconductor.

4. The method for manufacturing a semiconductor device according to claim 1, wherein the first conductive film and the second conductive film are formed using a material containing aluminum.

5. The method for manufacturing a semiconductor device according to claim 4, wherein a maximum temperature of a heat treatment after the first conductive film or the second conductive film is formed is 380° C. or lower.

6. The method for manufacturing a semiconductor device according to claim 1, wherein the first conductive film and the second conductive film are formed using a material containing copper.

7. The method for manufacturing a semiconductor device according to claim 6, wherein a maximum temperature of a heat treatment after the first conductive film or the second conductive film is formed is 450° C. or lower.

8. A method for manufacturing a semiconductor device comprising the steps of:
    forming a first conductive film over a substrate;
    forming a first resist mask over the first conductive film;
    forming a first gate electrode and a second gate electrode by selectively etching the first conductive film with the use of the first resist mask;
    forming a first insulating film over the first gate electrode and the second gate electrode;
    forming a semiconductor film over the first insulating film;
    forming a second resist mask over the semiconductor film;
    forming a first opening by selectively etching part of the semiconductor film and the first insulating film over the second gate electrode with the use of the second resist mask;
    forming a second conductive film so as to cover the semiconductor film and the first opening;
    forming a third resist mask over the second conductive film;
    forming a first source electrode, a first drain electrode, a second source electrode and a second drain electrode by selectively etching the second conductive film with the use of the third resist mask,
    wherein a first transistor comprises the first gate electrode, the first source electrode and the first drain electrode,
    wherein a second transistor comprises the second gate electrode, the second source electrode and the second drain electrode,
    wherein one of the first source electrode and the first drain electrode is electrically connected to a source or drain wiring,
    wherein the other of the first source electrode and the first drain electrode is electrically connected to the second gate electrode,
    wherein one of the second source electrode and the second drain electrode is electrically connected to a power source wiring, and
    wherein a capacitor comprises a first electrode having the same material as the second gate electrode and a second electrode having the same material as the power source wiring with the first insulating film and the semiconductor film therebetween;

forming a second insulating film over the first source electrode and the first drain electrode, the second source electrode and the second drain electrode, and the semiconductor film;

forming a fourth resist mask over the second insulating film;

forming a second opening by selectively etching the second insulating film and the semiconductor film with the use of the fourth resist mask and simultaneously forming a third opening in the second insulating film so as to expose part of the other of the second source electrode and the second drain electrode;

forming a third conductive film over the second insulating film so as to cover the third opening;

forming a fifth resist mask over the third conductive film; and forming a pixel electrode by selectively etching the third conductive film with the use of the fifth resist mask.

9. The method for manufacturing a semiconductor device according to claim 8 further comprising the steps of:
forming a third insulating film so as to cover the second opening, the third opening, and a periphery of the pixel electrode; and
forming a layer including a light-emitting element over the pixel electrode.

10. The method for manufacturing a semiconductor device according to claim 8, wherein the semiconductor film is an oxide semiconductor.

11. The method for manufacturing a semiconductor device according to claim 8, wherein the first conductive film and the second conductive film are formed using a material containing aluminum.

12. The method for manufacturing a semiconductor device according to claim 11, wherein a maximum temperature of a heat treatment after the first conductive film or the second conductive film is formed is 380° C. or lower.

13. The method for manufacturing a semiconductor device according to claim 8, wherein the first conductive film and the second conductive film are formed using a material containing copper.

14. The method for manufacturing a semiconductor device according to claim 13, wherein a maximum temperature of a heat treatment after the first conductive film or the second conductive film is formed is 450° C. or lower.

15. A method for manufacturing a semiconductor device comprising the steps of:
forming a first conductive film over a substrate;
forming a first resist mask over the first conductive film;
forming a first gate electrode and a second gate electrode by selectively etching the first conductive film with the use of the first resist mask;
forming a first insulating film over the first gate electrode and the second gate electrode;
forming a semiconductor film over the first insulating film;
forming a second resist mask over the semiconductor film;
forming a first opening by selectively etching part of the semiconductor film and the first insulating film over the second gate electrode with the use of the second resist mask;
forming a second conductive film so as to cover the semiconductor film and the first opening;
forming a third resist mask over the second conductive film;

forming a first source electrode, a first drain electrode, a second source electrode and a second drain electrode by selectively etching the second conductive film with the use of the third resist mask,
wherein a first transistor comprises the first gate electrode, the first source electrode and the first drain electrode,
wherein a second transistor comprises the second gate electrode, the second source electrode and the second drain electrode,
wherein one of the first source electrode and the first drain electrode is electrically connected to a source or drain wiring,
wherein the other of the first source electrode and the first drain electrode is electrically connected to the second gate electrode, and
wherein one of the second source electrode and the second drain electrode is electrically connected to a power source wiring;
forming a second insulating film over the first source electrode and drain electrode, the second source electrode and drain electrode, and the semiconductor film;
forming a third insulating film as a planarizing insulating film over the second insulating film;
forming a fourth resist mask over the third insulating film;
forming a second opening by selectively etching the third insulating film, the second insulating film, and the semiconductor film with the use of the fourth resist mask and simultaneously forming a third opening in the third insulating film and the second insulating film so as to expose part of the other of the second source electrode and the second drain electrode;
forming a third conductive film over the third insulating film so as to cover the third opening;
forming a fifth resist mask over the third conductive film; and
forming a pixel electrode by selectively etching the third conductive film with the use of the fifth resist mask.

16. The method for manufacturing a semiconductor device according to claim 15 further comprising the steps of:
forming a fourth insulating film so as to cover the second opening, the third opening, and a periphery of the pixel electrode; and
forming a layer including a light-emitting element over the pixel electrode.

17. The method for manufacturing a semiconductor device according to claim 15, wherein the semiconductor film is an oxide semiconductor.

18. The method for manufacturing a semiconductor device according to claim 15, wherein the first conductive film and the second conductive film are formed using a material containing aluminum.

19. The method for manufacturing a semiconductor device according to claim 18, wherein a maximum temperature of a heat treatment after the first conductive film or the second conductive film is formed is 380° C. or lower.

20. The method for manufacturing a semiconductor device according to claim 15, wherein the first conductive film and the second conductive film are formed using a material containing copper.

21. The method for manufacturing a semiconductor device according to claim 20, wherein a maximum temperature of a heat treatment after the first conductive film or the second conductive film is formed is 450° C. or lower.

22. A method for manufacturing a light-emitting display device, comprising the steps of:
forming a gate electrode over a substrate;
forming a first insulating film over the gate electrode;

forming a semiconductor film over the first insulating film;
forming a source electrode and a drain electrode over the semiconductor film;
forming a second insulating film over the source electrode and the drain electrode; and
through a photolithography process, forming a contact hole in the second insulating film by removing a first part of the second insulating film, and forming a patterned semiconductor film by removing a second part of the second insulating film and a part of the semiconductor film so as to expose a top surface of a part of the first insulating film; and
forming a pixel electrode over the second insulating film so as to cover the contact hole,
wherein the first part of the second insulating film overlaps with the drain electrode, and
wherein the second part of the second insulating film, the part of the semiconductor film and the part of the first insulating film do not overlap with the source electrode and the drain electrode.

23. The method for manufacturing a light-emitting display device according to claim 22, wherein the semiconductor film is an oxide semiconductor.

24. The method for manufacturing a light-emitting display device according to claim 22, wherein the gate electrode is formed using a material containing aluminum.

25. The method for manufacturing a light-emitting display device according to claim 24, wherein a maximum temperature of a heat treatment after the gate electrode is formed is 380° C. or lower.

26. The method for manufacturing a light-emitting display device according to claim 22, wherein the gate electrode is formed using a material containing copper.

27. The method for manufacturing a light-emitting display device according to claim 26, wherein a maximum temperature of a heat treatment after the gate electrode is formed is 450° C. or lower.

* * * * *